United States Patent
Qiu et al.

(10) Patent No.: US 8,237,531 B2
(45) Date of Patent: Aug. 7, 2012

(54) TUNABLE HIGH QUALITY FACTOR INDUCTOR

(75) Inventors: Ping Qiu, Singapore (SG); Chirn Chye Boon, Singapore (SG); Johnny Kok Wai Chew, Singapore (SG); Kiat Seng Yeo, Singapore (SG); Manh Anh Do, Singapore (SG); Lap Chan, Singapore (SG); Suh Fei Lim, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 413 days.

(21) Appl. No.: 11/967,270

(22) Filed: Dec. 31, 2007

(65) Prior Publication Data

US 2009/0167466 A1  Jul. 2, 2009

(51) Int. Cl.
*H01F 5/00* (2006.01)
*H01F 27/28* (2006.01)
*H03J 3/00* (2006.01)

(52) U.S. Cl. .......... 336/200; 336/65; 336/223; 336/232; 334/40

(58) Field of Classification Search .............. 336/65, 336/223, 232, 200; 334/40
See application file for complete search history.

(56) References Cited

U.S. PATENT DOCUMENTS

| | | | |
|---|---|---|---|
| 5,994,985 A | | 11/1999 | Pehlke et al. |
| 6,169,461 B1 * | | 1/2001 | Andoh et al. ............ 331/117 D |
| 6,201,287 B1 * | | 3/2001 | Forbes ........................ 257/528 |
| 6,434,021 B1 * | | 8/2002 | Collmeyer et al. ........ 363/21.01 |
| 6,608,361 B2 | | 8/2003 | Chang et al. |
| 6,822,434 B2 | | 11/2004 | Haslett et al. |
| 7,598,838 B2 * | | 10/2009 | Hargrove et al. ............ 336/200 |
| 2004/0046616 A1 * | | 3/2004 | Prentice ........................ 331/111 |
| 2006/0033602 A1 * | | 2/2006 | Mattsson ....................... 336/200 |
| 2007/0207754 A1 * | | 9/2007 | Gomi ......................... 455/193.3 |
| 2008/0129434 A1 * | | 6/2008 | Khajehpour ................... 336/139 |

OTHER PUBLICATIONS

William B. Kuhn et al., Analysis of Current Crowding Effects in Multiturn Spiral Inductors, IEEE Transactions on Microwave Theory and Techniques, Jan. 2001, p. 31-38, vol. 49, No. 1.
Chih-Chun Tang et al., Miniature 3-D Inductors in Standard CMOS Process, IEEE Journal of Solid-State Circuits, Apr. 2002, p. 471-480, vol. 37, No. 4.
Fleana Albertoni et al., Tuned LNA for RFICs using Boot-Strapped Inductor, IEEE Radio Frequency Integrated Circuits Symposium, 2001, p. 83-86.
Bogdan Georgescu et al., Tunable Coupled Inductor Q-Enhancement for Parallel Resonant LC Tanks, IEEE Transactions on Circuits and Systems-II: Analog and Digital Signal Processing, Oct. 2003, p. 705-713, vol. 50, No. 10.
Hongrui Jiang et al., On-Chip Spiral Inductors Suspended over Deep Copper-Lined Cavities, IEEE Transactions on Microwave Theory and Techniques, Dec. 2000, p. 2415-2423, vol. 48, No. 12.
C. Patrick Yue et al., On-Chip Spiral Inductors with Patterned Ground Shields for Si-based RF IC's, IEEE Journal of Solid-State Circuits, May 1998, p. 743-752, vol. 33, No. 5.
Y.-C. Wu et al., On-Chip High-Q (>3000) Transformer-Type Spiral Inductors, Electronics Letters, Jan. 31, 2002, p. 112-113, vol. 38, No. 3.

(Continued)

*Primary Examiner* — Elvin G Enad
*Assistant Examiner* — Ronald Hinson
(74) *Attorney, Agent, or Firm* — Horizon IP Pte Ltd

(57) ABSTRACT

An inductor circuit with high quality (Q) factor includes a primary inductor and a compensation sub-circuit. The compensation sub-circuit is electrically isolated from the primary inductor. The compensation sub-circuit is magnetically coupled with the primary inductor to compensate the loss in the primary inductor.

25 Claims, 32 Drawing Sheets

OTHER PUBLICATIONS

Sang-Woong Yoon et al., High-Performance 2-GHz CMOS LC VCO with High-Q Embedded Inductors Using Wiring Metal Layer in a Package, IEEE Transactions on Advanced Packaging, Aug. 2006, p. 639-646, vol. 29, No. 3.

D. R. Pehlke et al., Extremely High-Q Tunable Inductor for Si-Based RF Integrated Circuit Applications, Electron Devices Meeting, Dec. 7-10, 1997, p. 63-66.

Dandan Li et al., Design Techniques for Automatically Tuned Integrated Gigahertz-Range Active LC Filters, IEEE Journal of Solid-State Circuits, Aug. 2002, p. 967-977, vol. 37, No. 8.

Theerachet Soorapanth et al., A 0-dB IL 2140 ±30 MHz Bandpass Filter Utilizing Q-Enhanced Spiral Inductors in Standard CMOS, IEEE Journal of Solid-State Circuits, May 2002, p. 579-586, vol. 37, No. 5.

* cited by examiner

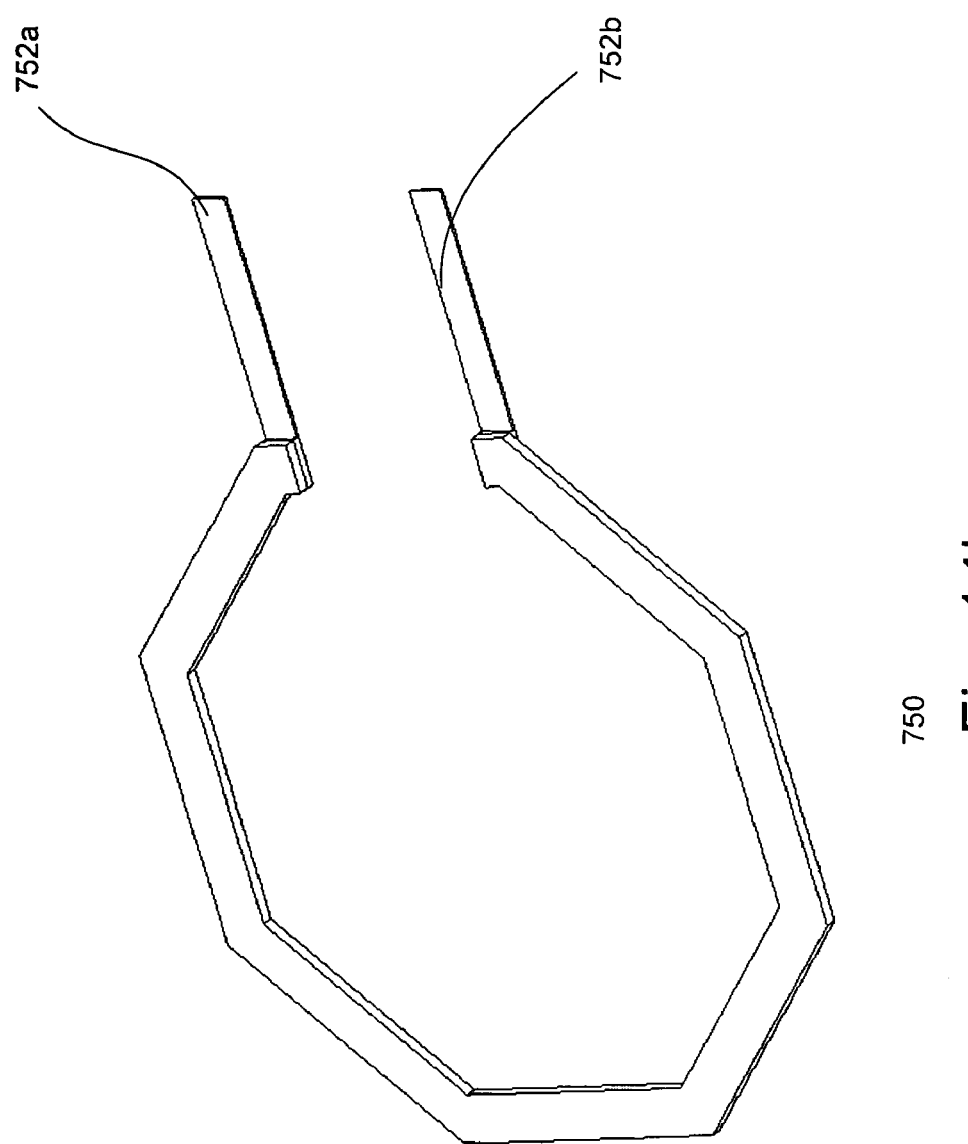

TUNABLE HIGH QUALITY FACTOR INDUCTOR

FIELD OF THE INVENTION

The present invention relates to integrated circuits (ICs) and more particularly to high quality (Q) factor inductors used in integrated circuits.

BACKGROUND OF THE INVENTION

Inductors are important components in many of the building blocks in wireless communication systems, such as RF bandpass filters, oscillators, impedance matching networks, emitter degeneration circuits, and/or baluns. Wireless communication standards place stringent requirements on performance and operating parameters, such as noise interference/immunity and power consumption. To accommodate the stringent requirements, high Q inductors are needed. One major obstacle in integrating communication ICs is the lack of high performance passive components, such as on-chip inductors.

Ideally, an inductor acts as a purely reactive device. However, in reality, the performance of an inductor is impacted by parasitic losses distributed within the inductor. FIG. 1 shows a model of a "real" inductor 100. The real inductor incurs losses, referred to as a "lossy inductor". The losses can be due to, for example, built in resistance of the wire. The built in resistance 120 acts as though it were connected in series with the ideal inductor 110. Other losses can also include those due to, for example, skin effect, proximity effect, as well as eddy current in the underlying substrate. The losses incurred by the inductor are represented as $R_s$ or effective series resistance. The total impedance Z of the circuit is defined as:

$$Z = R_s + X_L$$

The total impedance includes a real component $R_s$ and an imaginary component $X_L$ which is the effective reactance. The effective reactance of the inductor $X_L$ is equal to $j\omega L$. As such the total impedance Z of the inductor is defined as:

$$Z = R_s + j\omega L$$

The Q factor indicates how close a real inductor is to an ideal inductor. The higher the Q factor, the more pure is the inductor. Typically, a high Q factor is associated with a low signal loss. The Q factor is defined as follows:

$$Q = \frac{\text{Im}(Z)}{\text{Re}(Z)} = \frac{\omega L}{R_s}$$

In reality, $R_s$ is large due to various parasitic effects, which leads to a low Q. To increase Q, active inductors have been proposed. However, such active inductors have peak Q at low frequencies and only over a narrow bandwidth. As such, conventional inductors are not applicable for high frequency or wide bandwidth applications.

Referring to FIG. 2, performance of a conventional inductor is shown. Line 210 plots the Q factor as a function of frequency while line 220 plots the inductance as a function of frequency. As shown, the conventional inductor has a peak Q 215 of about 6.9 at 8.5 GHz and a peak inductance 225 of 6.3 E-10 at about 12.9 GHz.

From the foregoing, it is desirable to provide high Q inductors which can be operated at high frequencies and/or over a broad frequency range.

SUMMARY OF THE INVENTION

The present invention relates to ICs, more particularly relates to high quality inductors used in integrated circuits. An integrated circuit and an inductor circuit are disclosed. In one aspect of the invention, the integrated circuit comprises an inductor circuit. The inductor circuit includes a primary inductor and a compensation sub-circuit. The compensation sub-circuit is electrically isolated from the primary inductor and is magnetically coupled with the primary inductor. Such arrangement is useful to compensate loss in the primary inductor and Q factor of the inductor circuit is enhanced.

A method of increasing Q factor of an inductor is presented in another aspect of the invention. The method includes providing a primary inductor which incurs a loss equal to $R_1$. The method further includes generating a negative inductance $R_{neg}$ by magnetic coupling a feedback loop of a compensation sub-circuit, wherein the $R_{neg}$ reduces $R_1$ to increase Q factor of the inductor.

In another aspect of the invention, an inductor is presented. The inductor includes a substrate having a dielectric layer. The inductor further includes first, second and third inductors. The first inductor comprises inner and outer continuous concentric loops which are separated by a first inductor loop spacing in a first plane. The second inductor is interleaved with the first inductor within the first inductor loop spacing in the first plane. The third inductor is disposed in a second plane of the dielectric layer and stacked with respect to the first inductor separated by an interlevel inductor spacing.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

FIGS. 14a-c show inductors individually in accordance with one embodiment of the invention;

DESCRIPTION OF THE INVENTION

The present invention relates generally to ICs. More particularly, the present invention relates to high Q inductor designs. In one embodiment, the high Q inductors are used in various types of circuits, such as voltage controlled oscillators (VCOs), bandpass filters, low noise amplifiers (LNAs) or LC circuits. Such high Q inductors can also be incorporated in other types of circuits. The high Q inductor designs are particularly useful for on-chip applications, facilitating integration of, for example, wireless communication ICs. The inductors can also be incorporated into other types of ICs. Providing the inductors as discrete components is also useful. The ICs, for example, are incorporated into wireless communication products. Incorporating the ICs into other types of products is also useful.

Figure 1:
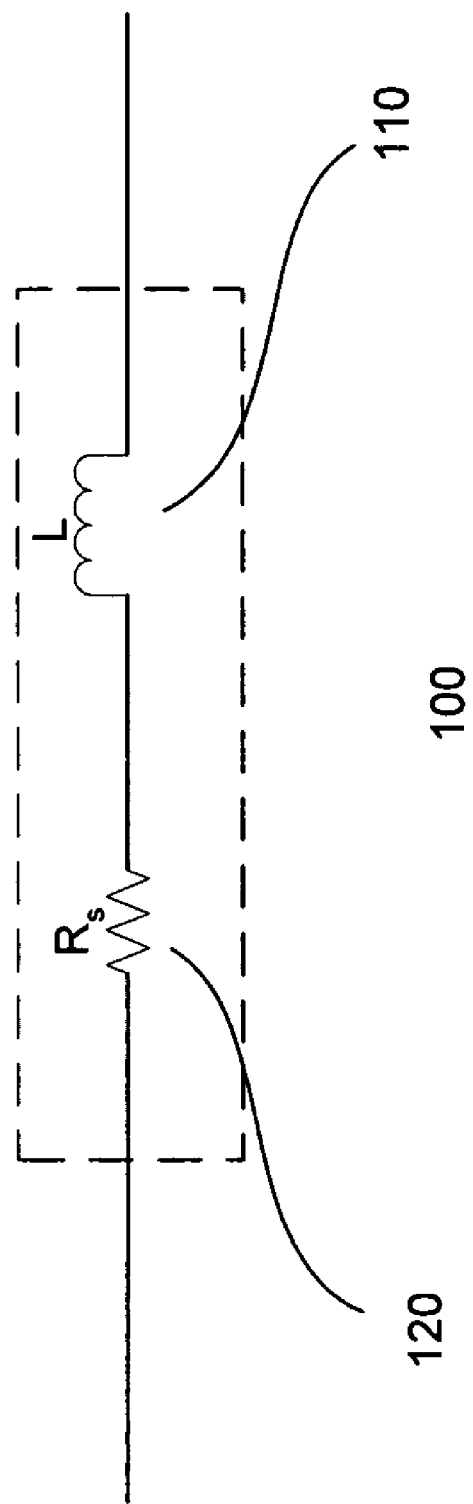
FIG. 1 shows a general inductor.
Figure 2:
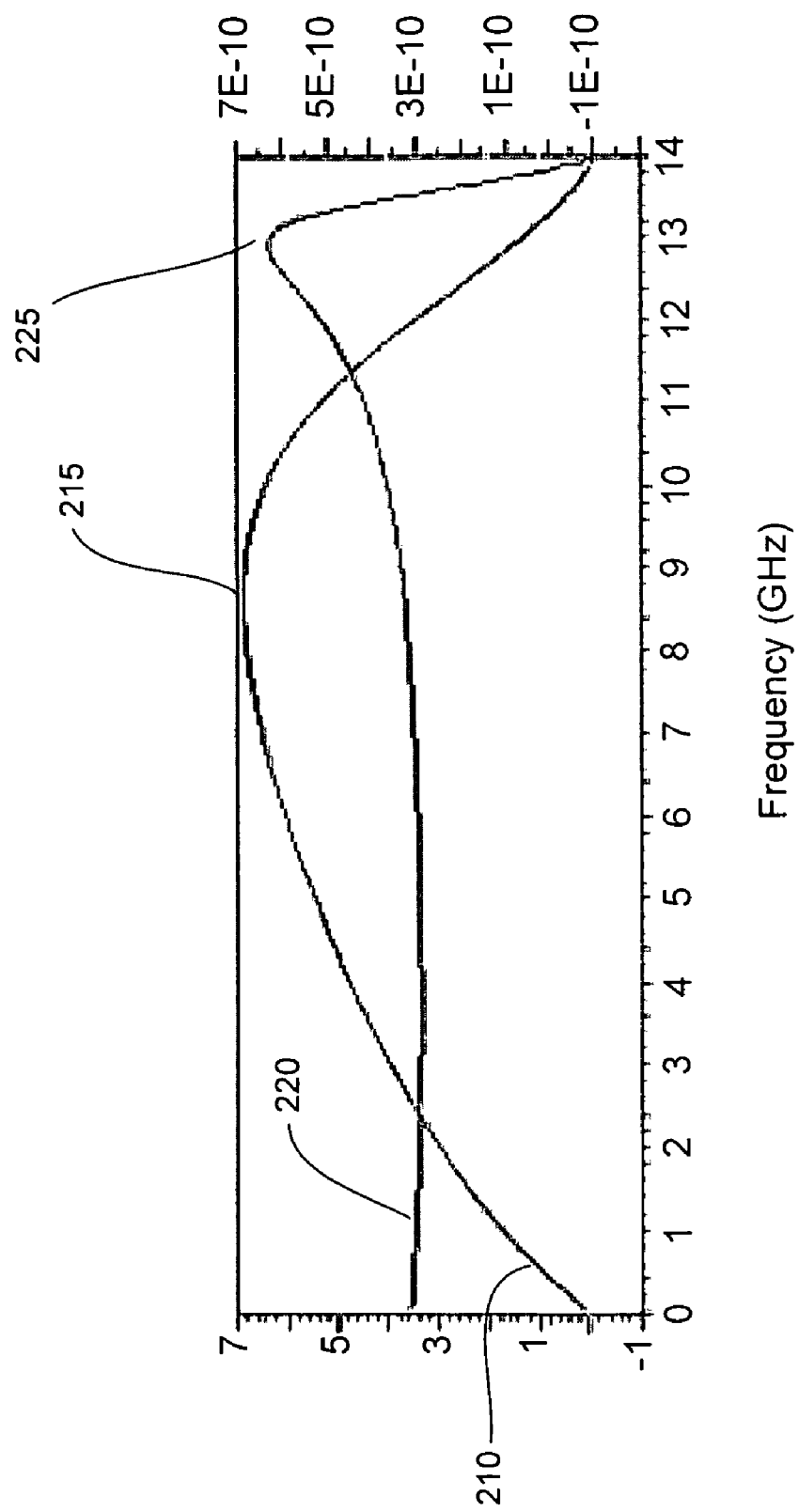
FIG. 2 shows the relationship between loss factor and quality factor.
Figure 3:
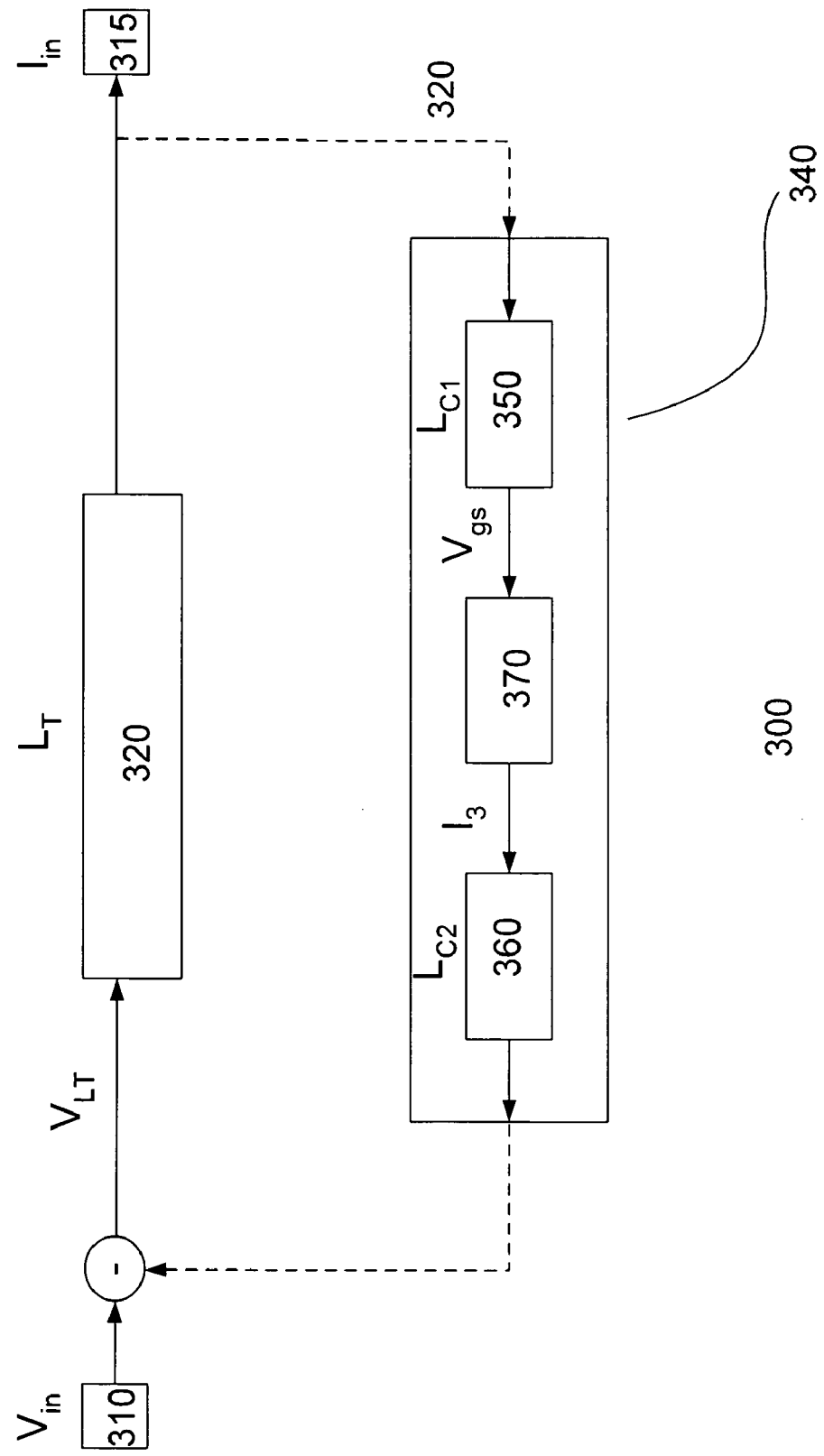
FIG. 3 shows a high Q factor inductor model in accordance with one embodiment of the invention.

FIG. 3 shows a high Q inductor model 300 in accordance with one embodiment of the invention. The high Q inductor model comprises a primary or target inductor 320. The inductor model includes first and second terminals 310 and 315. For example, when an input voltage $V_{in}$ is applied across the terminals of the primary inductor, a current $I_{in}$ is generated. As discussed, the primary inductor incurs a loss caused by $R_T$. To compensate for the loss, a compensation circuit 340 is provided. The compensation circuit provides a feedback loop 320 to the primary inductor which reduces the loss incurred by the target inductor.

When considered alone, the target inductor's impedance Z is equal to:

$$Z_{LT} = R_T + X_T$$
$$= R_T + j\omega L_T$$

As discussed, the target inductor incurs a loss which negatively impacts the Q factor. The quality factor $Q_{LT}$ of the target inductor can be represented by the following equation:

$$Q_{LT} = \frac{\omega L_T}{R_T}$$

where $L_T$ is inductance of the target inductor and $R_T$ is parasitic resistance. The compensation circuit increases the $Q_{LT}$ by compensating for the loss incurred due to $R_T$. In one embodiment, the $Q_{LT}$ is increased by reducing $R_T$. To reduce $R_T$, the compensation circuit generates a negative resistance $R_C$ to reduce $R_T$. In a preferred embodiment, $|R_C|$ is substantially equal to $R_T$. For example, $|R_C|$ is equal to at least about 90-95% of $R_T$. Other values of $|R_C|$ can also be useful to tailor the inductor with the desired quality factor.

The amount of negative resistance required, which is $R_C$, depends on frequency, amount of loss $R_T$ to compensate and the quality factor desired $Q_{desired}$, as illustrated by the following:

$$Q_{desired} = \frac{\omega L_T}{R_{eff}}, \text{ and}$$
$$R_{eff} = R_T - |R_C|$$

Substituting $R_{eff}$ into the equation for $Q_{desired}$ gives rise to the following:

$$Q_{desired} = \frac{\omega L_T}{R_T - |R_C|}.$$

Solving for $|R_C|$ results in:

$$|R_C| = R_T - \frac{\omega L_T}{Q_{desired}}.$$

For example, at f=10 GHz, $L_T$=3 nH, $R_T$=10 Ohm and $Q_{desired}$=500, the above equation indicates that the $|R_C|$ or negative resistance is 9.62 Ohm.

In accordance with embodiment of the invention, the compensation circuit provides the feedback by magnetic coupling, as indicated by dotted line of the feedback path. The compensation, in one embodiment, comprises first compensation inductor ($L_{C1}$) 350 and second compensation inductor ($L_{C2}$) 360 coupled by a variable gain amplifier (VGA) 370 which produces a transconductance $g_m$. Mutual coupling between the compensation inductors should be as small as possible to minimize the power consumption. As mutual coupling between the compensation inductors increase, power consumption increases. The first and second compensation inductors form first and second compensation transformers via mutual inductance with the target inductor.

For purposes of simplifying the initial analysis, the model assumes that all components except for the target inductor are ideal, for example, compensation inductors incur no energy loss, the compensation inductors are perfectly decoupled, and the transconductance $g_m$ is constant over the entire frequency range.

In operation, the first compensation inductor serves as a sensing inductor. The sensing inductor samples a signal from the target inductor. Preferably, the signal sensed is a small signal. The small signal comprises, for example, AC signal such as an AC current or AC voltage. In one embodiment, the small signal comprises an AC current signal. Typically, the AC current signal is $\leq 1$ mA. Other values or types of signals are also useful. VGA amplifies the sampled small signal and converts the sampled AC voltage. The amplified signal is fed into the feedback inductor. Through mutual inductance between the feedback inductor and primary inductor, energy is fed back to the main circuit to compensate for the energy loss by the primary inductor.

With the compensation sub-circuit, the effective impedance of target-inductor $L_1$ becomes:

$$Z_{eff} = j\omega L_T + (R_T - \omega^2 M_{TC1} M_{C2T} * g_m).$$

The effective series resistance $R_{eff}$, inductance $L_{eff}$ and Quality factor $Q_{eff}$ seen from the terminals of inductor $L_1$ can be written as:

$$R_{eff} = R_T - \omega^2 M_{TC1} M_{C2T} * g_m;$$

$$L_{eff} = L_T; \text{ and}$$

$$Q_{eff} = \frac{\omega L_{eff}}{R_{eff}} = \frac{\omega L_T}{R_T - \omega^2 M_{TC1} M_{C2T} g_m}.$$

From $Q_{eff}$, a lossless inductor can be easily obtained while mutual inductances and transconductance are properly chosen to result in $R_{eff}=0$. For example, the compensation sub-circuit compensates for energy loss by generating a negative resistance having a value which is equal to about $R_T$. As discussed, the negative resistance is generated using first and second compensation inductors. Providing a compensation sub-circuit with other number of inductors which generate a negative resistance is also useful.

Figure 4:
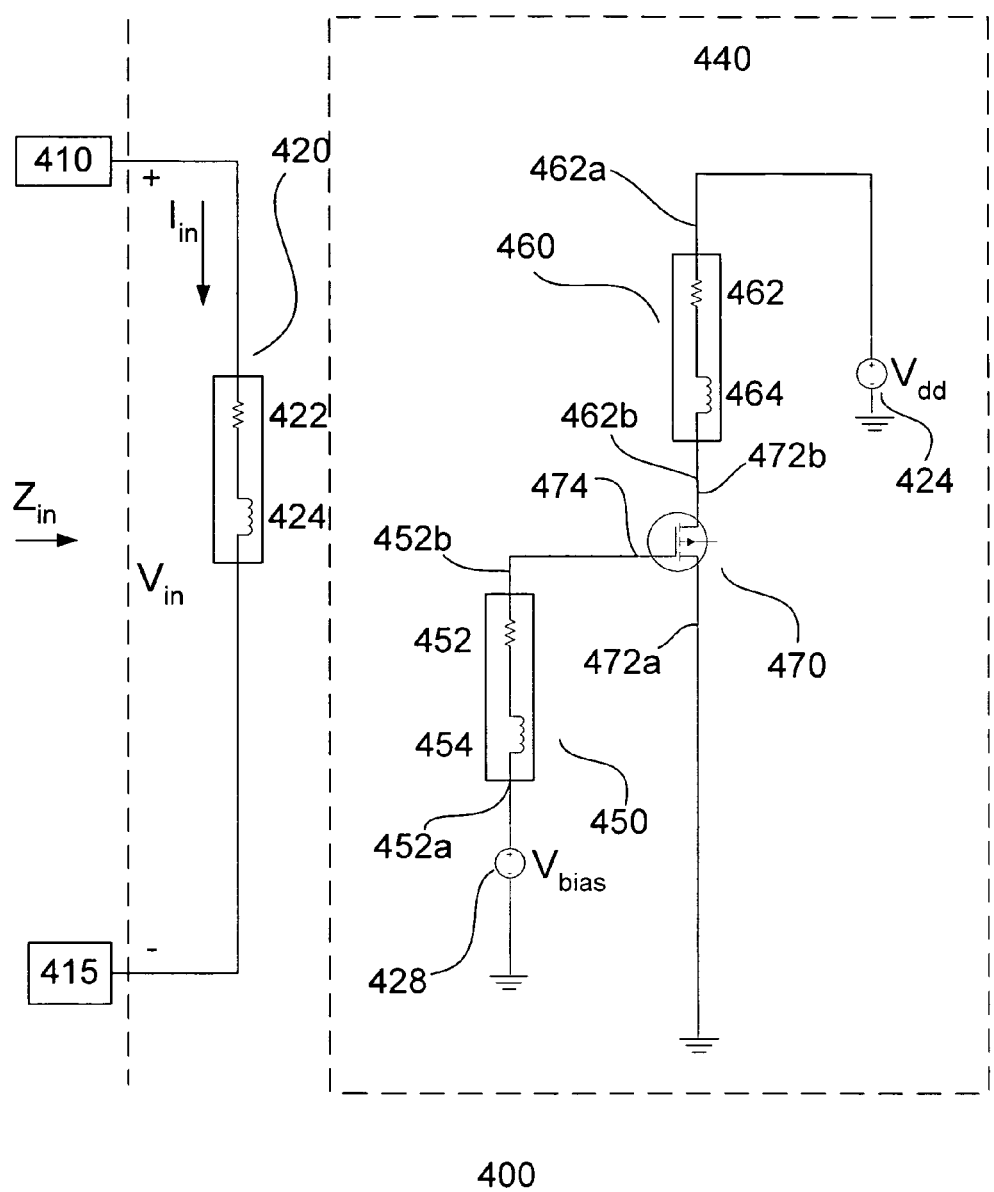
FIG. 4 shows a high Q factor inductor circuit in accordance with one embodiment of the invention and the AC equivalent of the high Q inductor.

FIG. 4 shows a high Q inductor circuit 400 in accordance with one embodiment of the invention. The high Q inductor circuit comprises a primary inductor 420. The primary inductor is represented by parasitic resistance ($R_1$) 422 and a primary inductor ($L_1$) 424. The primary inductor circuit includes first and second terminals 410 and 415 between which an input voltage $V_{in}$ is applied. Typically, the terminals are coupled to other circuit elements (not shown). The other circuit elements can be collectively referred to as the main circuit. The input voltage generates an input current $I_{in}$ which flows through the primary inductor. The primary inductor comprises an impedance $Z_{in}$ which is equal to $R_1 + j\omega L_1$.

The high Q inductor circuit also includes a compensation sub-circuit 440. In one embodiment, the compensation circuit is magnetically coupled to the primary inductor. The compensation circuit creates a magnetically coupled feedback to compensate for loss in the primary inductor, which results in increasing the Q factor. In one embodiment, the compensation circuit produces a negative resistance to compensate for loss in the primary inductor.

The compensation sub-circuit comprises a first compensation inductor 450 having first and second terminals 452a-b. The compensation sub-circuit further comprises a second compensation inductor 460 with first and second terminals 462a-b. Like the primary inductor, the second inductors are represented by resistances ($R_2$ and $R_3$) 452 and 462 and inductors ($L_2$ and $L_3$) 454 and 464. In one embodiment, the first compensation inductor serves as a sensing inductor and the second compensation inductor serves as a feedback inductor. Providing other number of inductors in the compensation sub-circuit to generate the negative resistance is also useful.

A VGA 470 having a transconductance $g_m$ is provided, coupling the first and second compensation inductors. In one embodiment, the VGA comprises a transistor having first and second terminals 472a-b and a control terminal 474. In one embodiment, the transistor comprises, for example, a metal oxide semiconductor (MOS). In one embodiment, the VGA comprises a n-type MOS (nMOS) transistor. The body of the nMOS transistor is grounded. Providing the VGA with other types of transistors may also be useful. For example, the VGA can be a bipolar junction transistor (BJT). Other types of VGAs are also useful. For example, programmable digital amplifiers can also be used.

In one embodiment, the second terminal of the first compensation inductor is coupled to the control terminal of the VGA. Preferably, the second terminal of the first compensation inductor is directly connected to the control terminal of the VGA. The control terminal, for example, is the gate terminal of the transistor. The first terminal of the second compensation inductor is coupled to an operating voltage ($V_{dd}$) 424 of the compensation sub-circuit while the second terminal is coupled to a second terminal of the VGA. The first terminal of the VGA is coupled to ground.

The primary inductor and first compensation inductor forms a first transformer with mutual inductance $M_{12}$. Likewise, the primary inductor and second compensation inductor form a second transformer with mutual inductance $M_{31}$.

When $V_{in}$ is applied between the terminals of the primary inductor, an AC current $I_{in}$ is generated. This current is sensed by sensing inductor due to the mutual inductance $M_{12}$ with the primary inductor. This sampled signal is amplified by the VGA and fed to the feedback inductor. The mutual inductance $M_{31}$ between the feedback inductor and primary inductor creates a feedback. In one embodiment, the feedback generates a negative resistance ($R_C$) to compensate for the energy loss in the primary inductor. The negative resistance is:

$$R_C = -\omega^2 M_{12} M_{31} * g_m$$

Coupling the first and second compensation inductors in a different configuration can also be useful to provide loss compensation to the primary inductor. In another embodiment, the VGA comprises a p-type transistor. For p-type transistor applications, the functions of the first and second compensation inductors are reversed. That is, the second compensation inductor serves as the sensing inductor and the first compensation inductor provides the feedback for compensating the loss of the primary inductor.

In one embodiment, $g_m$ of the VGA can be electrically varied or tuned to the desired value. By having the ability to vary $g_m$, the negative resistance of the compensation sub-circuit $|R_C|$ can be tuned to the desired value. This in turn, enables the tuning of the amount of Q enhancement or amount of compensation to control the Q factor of the inductor. The $g_m$ can be tuned, in one embodiment, by varying the gate to source voltage $V_{gs}$ of the VGA transistor. The gate to source voltage $V_{gs}$ is equal to $V_{g-Vs}$. To change $V_{gs}$, either $V_g$ or $V_s$ or both can be changed. In one embodiment, a bias voltage 428 is employed to change $V_{gs}$. Other techniques of changing $V_{gs}$ are also useful. The bias voltage typically comprises a DC voltage. For example, the bias voltage is about 0.6 V. Other values can also be useful, depending on parameters such as transistor size and desired $g_m$. An automatic gain control loop can be used to control the bias voltage. In one embodiment, the $V_{bias}$ is indirectly coupled to the control terminal of the VGA via the first terminal of the sensing inductor.

As described, the compensation sub-circuit is electrically isolated from primary inductor. For example, the biasing of the main circuit to which the primary inductor is connected and the biasing of the compensation sub-circuit are independent. As such, there is no constraints on circuit topography of the main circuit, which facilitate greater design flexibility.

Figure 5:
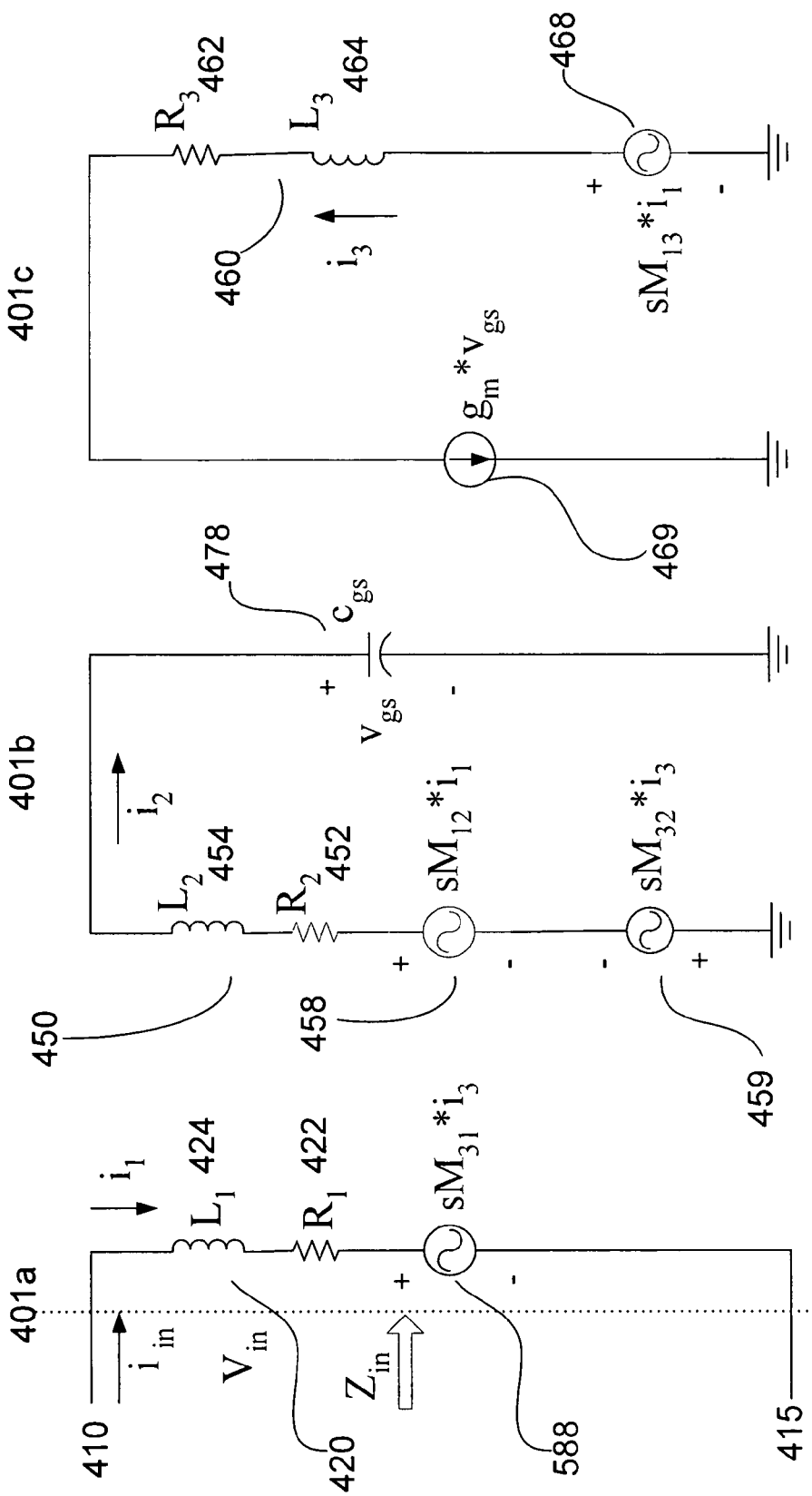
FIG. 5 shows a small signal equivalent of a high Q inductor circuit in accordance with one embodiment of the invention.

FIG. 5 shows a small signal equivalent of the high Q inductor circuit of FIG. 4. The high Q inductor can be represented by individual inductor blocks 401a-c corresponding to the primary inductor ($L_1$), first compensation inductor ($L_2$) and second compensation inductor ($L_3$). The loss factors associated with the inductors are modeled as a first resistor ($R_1$) 422, a second resistor ($R_2$) 452 and a third resistor ($R_3$) 462. The primary and compensation inductors have inherent impedances $X_{L1}$, $X_{L2}$ and $X_{L3}$.

Table 1 explains the symbols of the small signal circuit in FIG. 5.

TABLE 1

| | |
|---|---|
| $L_1$, $L_2$ and $L_3$ | inductance of inductor 1, inductor 2 and inductor 3 respectively |
| $R_1$, $R_2$ and $R_3$ | parasitic resistance of inductor 1, inductor 2 and inductor 3 |
| *$M_{12} = M_{21}$ | mutual inductance between inductor 1 and inductor 2 |
| *$M_{32} = M_{23}$ | mutual inductance between inductor 2 and inductor 3 |
| *$M_{31} = M_{13}$ | mutual inductance between inductor 1 and inductor 3 |
| $g_m$ | transconductance of the amplification transistor |
| $i_1$, $i_2$, $i_3$ | Inductors' currents |

Although our analysis assumes that the transformer have symmetric properties to simplify the analysis, it is also applicable for asymmetric transformers. To simplify the analysis, the effect of gate to drain capacitance $C_{gd}$ of the amplification transistor is ignored. Since there are three inductors in the circuit, 3 transformers are formed by their mutual inductances. The coupling effects can be represented by controlled voltage sources. In one embodiment, a first voltage source 588 is produced by $sM_{31}*i_3$ in the primary inductor block. Second and third voltage sources 458 and 459 are produced by $sM_{12}*i_1$ and $sM_{32}*i_3$ in the second inductor block. A fourth voltage source 468 is produced by $sM_{13}*i_1$ in the third inductor block. As a note, since $i_2$ is negligible compared to $i_1$ and $i_3$, the voltage sources induced by $i_2$ (e.g., $sM_{21}*i_2$ and $sM_{32}*i_2$) are ignored. In the second inductor block, there is a voltage drop $V_{gs}$ across the gate to source capacitance $C_{gs}$ 478 corresponding to the transistor of VGA. Also, in the third inductor block, a current source 469 is produced by $g_m*V_{gs}$.

In analyzing the circuit, $V_{gs}$ can be derived as follows:

$$V_{gs} = \frac{X_{Cgs}}{X_{Cgs} + X_{L2} + R_2} \times (sM_{12}*i_1 + sM_{32}*i_3)$$
$$= W*(sM_{12}*i_1 - sM_{32}*i_3)$$

where $$W = \frac{X_{Cgs}}{X_{Cgs} + X_{L2} + R_2}.$$

The effective impedance of the high Q inductor can be derived as follows:

$$Z_{eff1} = (X_{L1} + R_1) + s*M_{31} \times \frac{sM_{12}*g_m*W}{1 + sM_{32}*g_m*W}$$
$$= (sL_1 + R_1) + s^2 M_{31} * M_{12} *$$

$$g_m \frac{(1 - \omega^2 L_2 C_{gs}) - s(R_2 C_{Cgs} + g_m M_{32})}{(1 - \omega^2 L_2 C_{gs})^2 + \omega^2(R_2 C_{gs} + g_m M_{32})^2}.$$

From the effective impedance, the effective resistance and effective inductance can be derived as follows:

$$R_{eff} = R_1 - \omega^2 M_{31} * M_{12} * g_m \frac{(1 - \omega^2 L_2 C_{gs})}{(1 - \omega^2 L_2 C_{gs})^2 + \omega^2 (R_2 C_{gs} + g_m M_{32})^2}$$

$$L_{eff} = L_1 + \omega^2 M_{31} * M_{12} * g_m \frac{(R_2 C_{Cgs} + g_m M_{32})}{(1 - \omega^2 L_2 C_{gs})^2 + \omega^2 (R_2 C_{gs} + g_m M_{32})^2}$$

In an ideal case, the gate capacitance of the amplification transistor $C_{gs}$ is small enough such that $X_{Cgs} \gg X_{L2}$, which completely decouples $L_2$ from $L_3$ (i.e., $M_{32}=0$). In doing so, the following occurs:

$$\omega^2 L_2 C_{gs} = \frac{X_{L2}}{X_{Cgs}} \approx 0 \text{ and } g_m M_{32} = 0$$

This would result in:

$$R_{eff} = R_1 - \omega^2 M_{12} M_{31} * g_m;$$
$$L_{eff} = L_1; \text{ and}$$
$$Q_{eff} = \frac{\omega L_{eff}}{R_{eff}} = \frac{\omega L_T}{R_1 - \omega^2 M_{TC1} M_{C2T} g_m}.$$

In practice, completely decoupling $L_2$ and $L_3$ is virtually impossible. Typically, $L_2$ and $L_3$ can be configured to have a weak coupling. For example, the coupling factor of $L_2$ and $L_3$ can be configured to be about 0.2. Although not completely decoupled, such a weak coupling can achieve the benefits of the invention, incurring a slight increase in power consumption and slight change in effective inductance. Furthermore, changing of the effective inductance can be advantageous, for example, for designing inductors with high inductance per unit area or to precisely control inductance to compensate the deviation from the desired value due to process tolerance.

Figure 6:
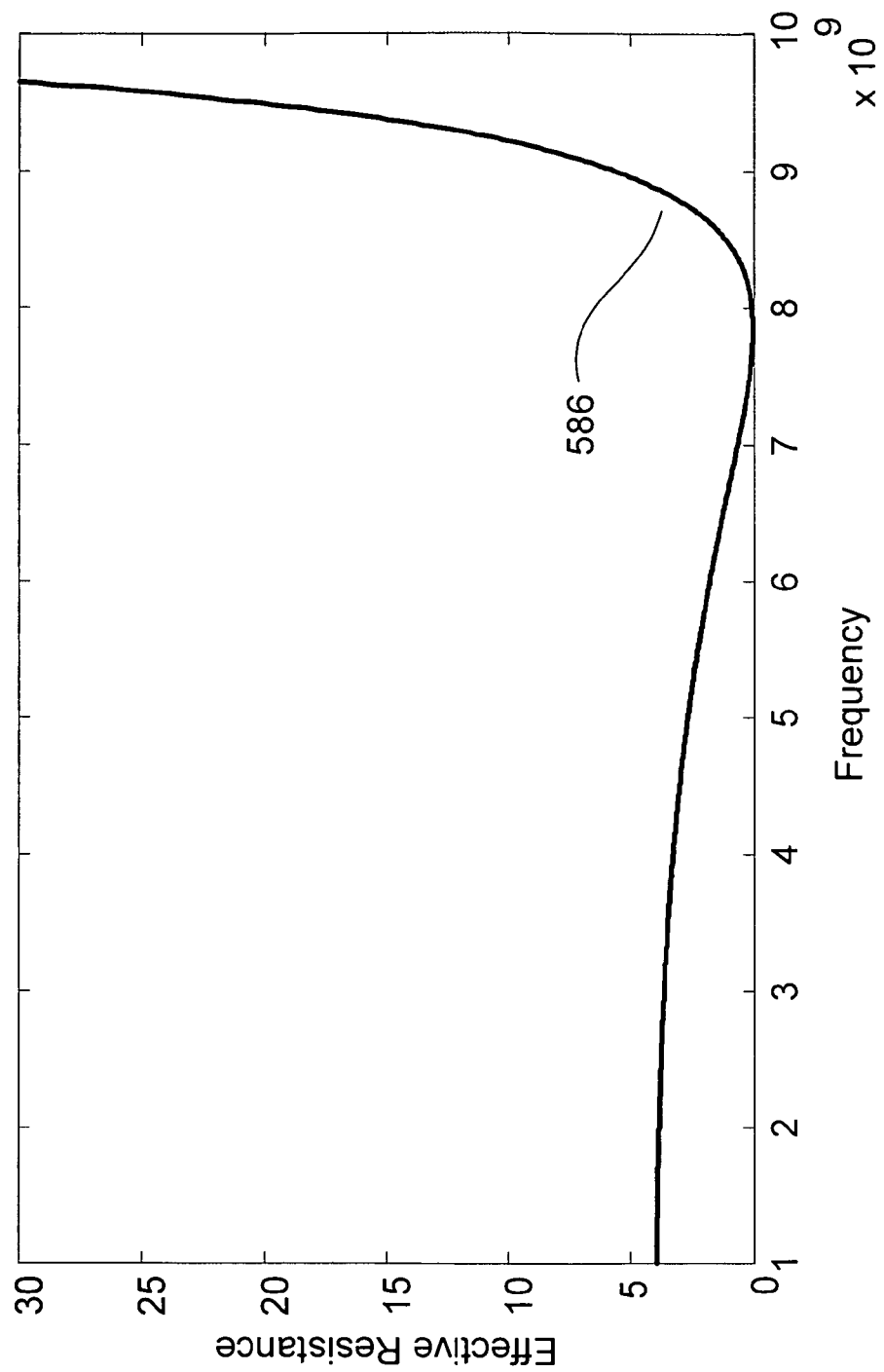
FIGS. 6-7 show the relationship of effective resistance and inductance with frequency respectively, of a high Q factor inductor in accordance with one embodiment of the invention. These two graphs are generated from equations. In which, constant pre-compensation effective inductance and resistance are chosen for better visualization on the impacts of the compensation circuit.

FIG. 6 shows the theoretical effective resistance of the high Q inductor in accordance with one embodiment of the invention. Line 586 plots the effective resistance as a function of frequency. The effective resistance at 1 GHz is about 4 and decreases to about 0 at about 8 GHz. Beyond 8 GHz, the effective resistance increases. The effective resistance at 9 GHz is equal to about the effective resistance at 1 GHz. Low effective resistance corresponds to a high Q factor. The frequency at which the lowest effective resistance value occurs corresponds to the peak Q frequency. The effective resistance plot of FIG. 6 evidences that the Q enhancement of the present invention can be effective over a broad frequency range.

Figure 7:
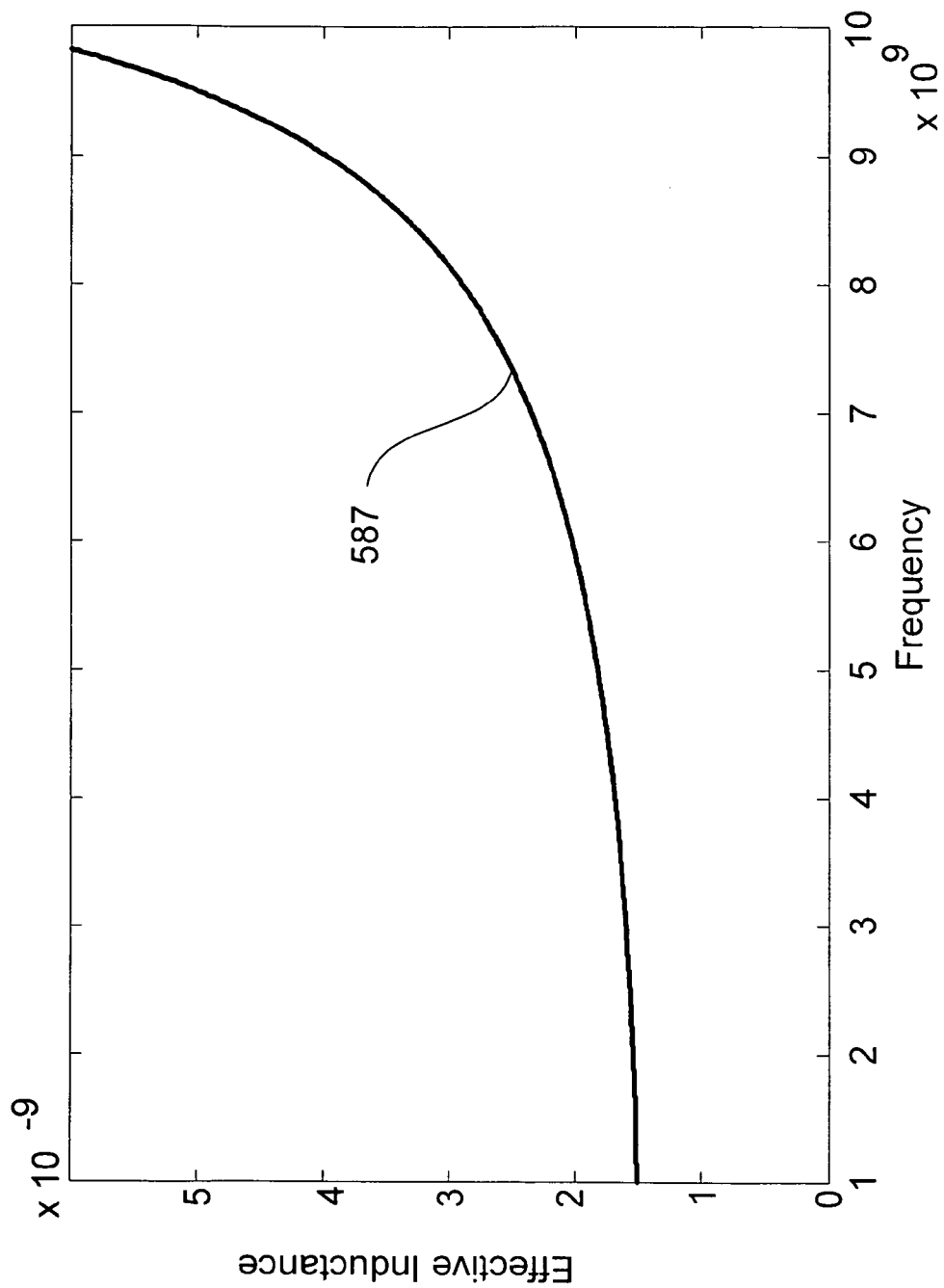

FIG. 7 shows the theoretical effective inductance of the high Q inductor in accordance with one embodiment of the invention. Line 587 plots the effective inductance as a function of frequency. The inductance increases with increasing frequency. By increasing the effective inductance, the Q factor can also be increased.

Figure 8A:
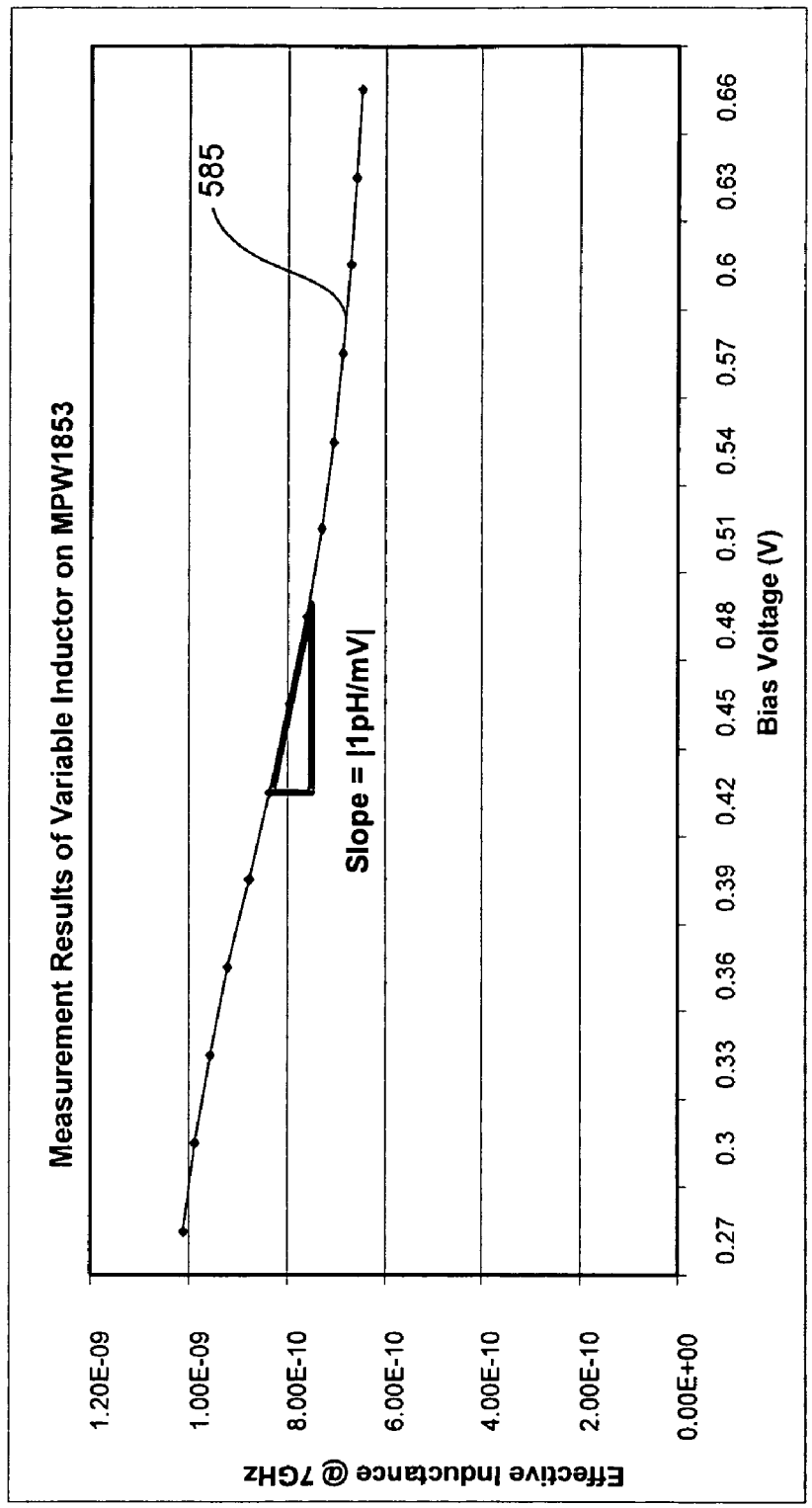
FIGS. 8a-c show various relationship among frequency, Q factor, inductance and bias voltage $V_{bias}$ of a high Q factor inductor circuit in accordance with one embodiment of the invention.

The bias voltage can impact the effective inductance of the high Q inductor circuit. A simulation is performed with the primary inductor having an inductance 0.51 nH. The simulation varies the bias voltage of the inductor from about 0.27 V to 0.66 V at a frequency of 7 GHz. The result of the simulation is plotted as line 585 in FIG. 8a. As shown, the effective inductance decreases as $V_{bias}$ is increased. For example, the effective inductance is equal to about $1.03 \times 10^{-9}$ H at a bias voltage of 0.27V and decreases to about $6.05 \times 10^{-9}$ H at a bias voltage of about 0.645 V. The inductance tunability can be determined using the following equation:

$$\frac{L_{eff} - L_1}{L_1} = \frac{1.03 - 0.51}{0.51} = 102\%$$

where $L_{eff}$ is the highest effective inductance; and
$L_1$ is the inductance of the primary inductor.
From the above equation, the effective inductance of the high Q inductor can be tuned to about 102% of the inductance of the primary inductor. As such, the bias voltage can be used to effectively control the inductance of the inductor circuit. For example, a change of biasing voltage of 1 mV can result in approximately 1 pH change.

Figure 8B:
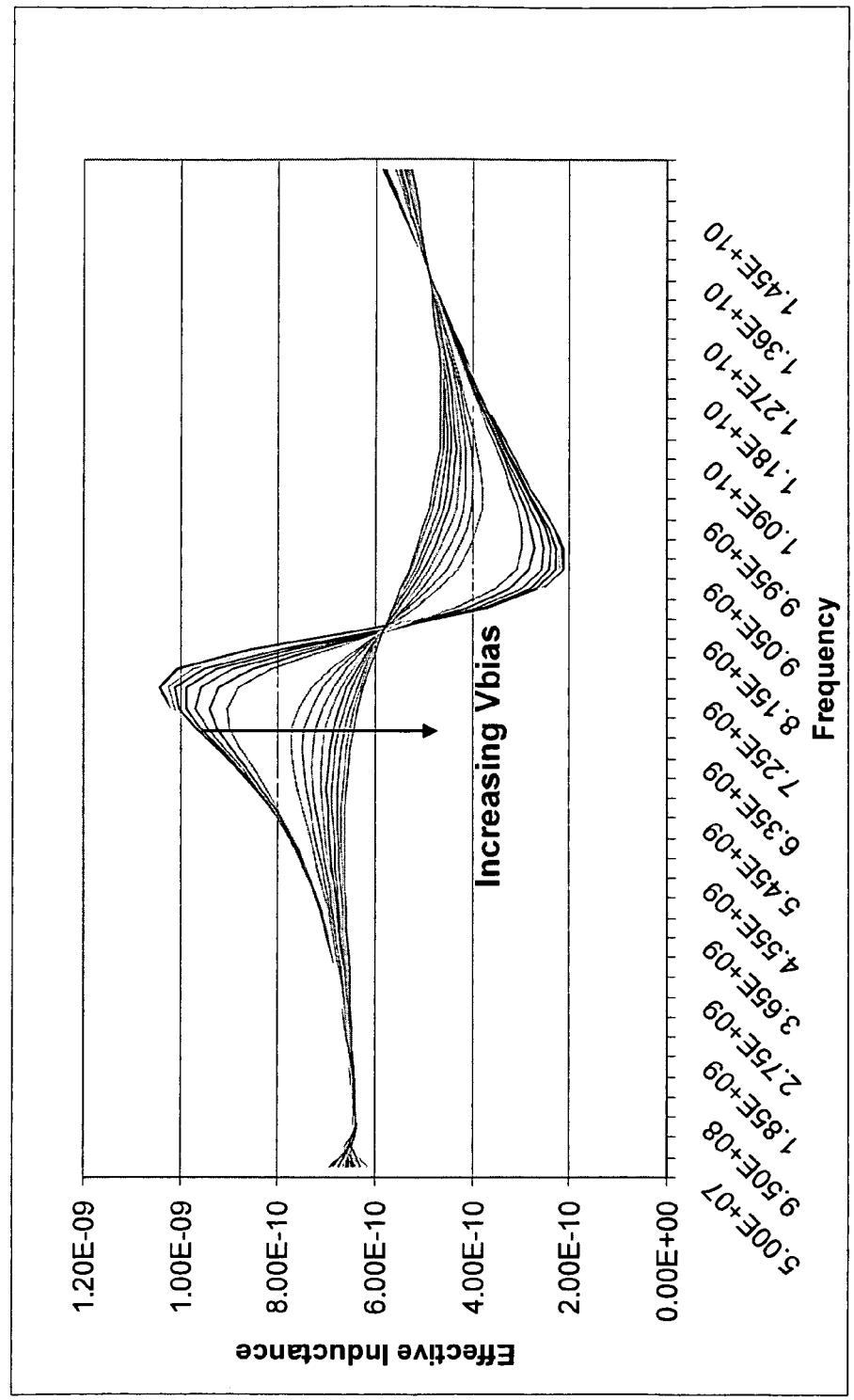

FIG. 8b shows the effective inductance of the high Q inductor circuit as a function of frequency at different values of $V_{bias}$. As shown, the effective inductance varies with frequency. However, within a specific frequency, the effective inductance can be tuned by adjusting $V_{bias}$. With increasing $V_{bias}$, the effective inductance decreases.

Figure 8C:
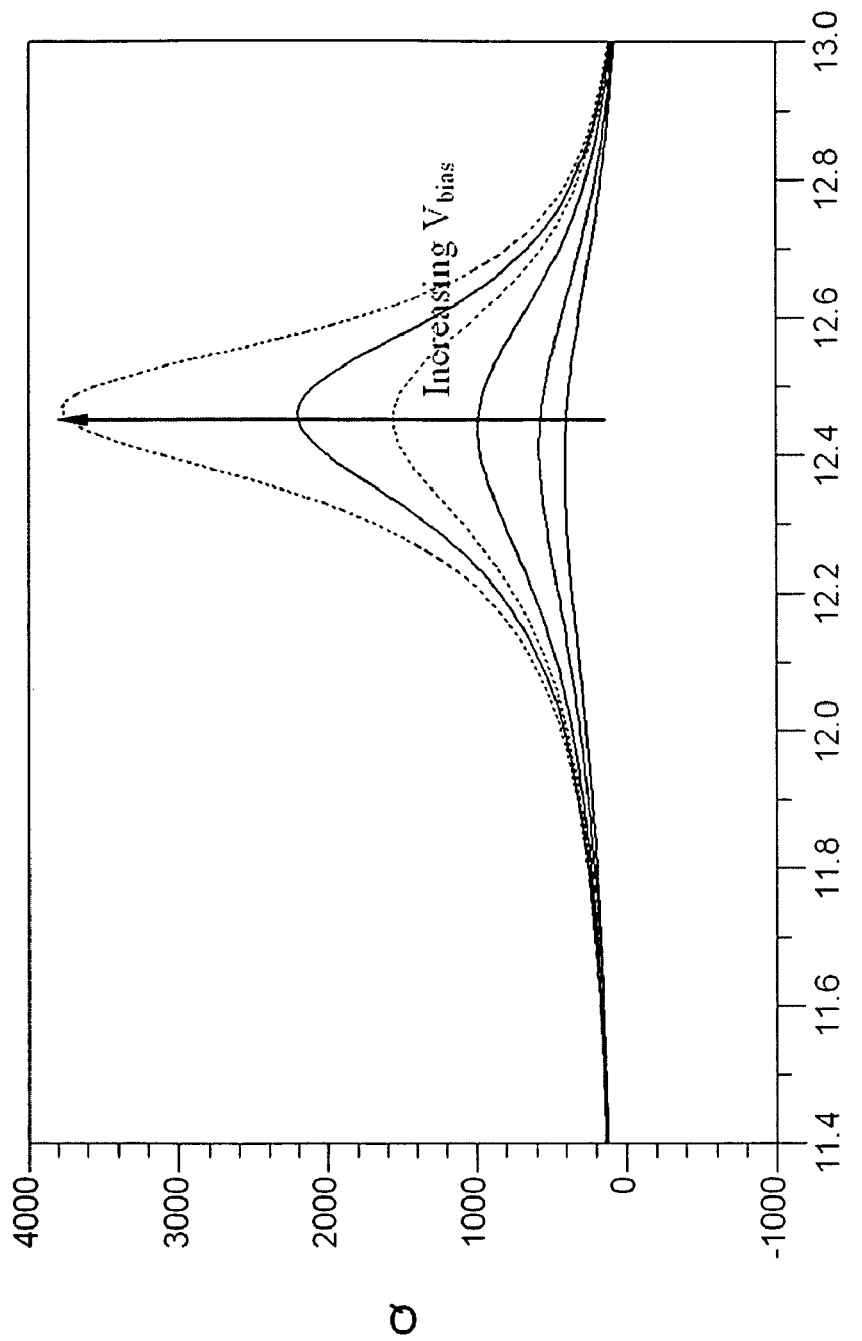

The Q factor can be varied at the frequency response of the inductor by adjusting bias voltage of the compensation circuit. FIG. 8c shows a graph of a high Q inductor which has its Q factor varied by adjusting the bias voltage ($V_{bias}$). The high Q inductor has a peak Q value at a frequency of 12.45 GHz, referred to as the peak frequency ($f_{peak}$). By changing $V_{bias}$, the Q value can be adjusted to the desired level. For example, increasing $V_{bias}$ increases Q of the inductor. Based on FIG. 8c, the high Q inductor of the present invention has a high bandwidth. For example, for Q>100, the bandwidth is >1.5 GHz and is >400 MHz for Q>1000.

Figure 9:
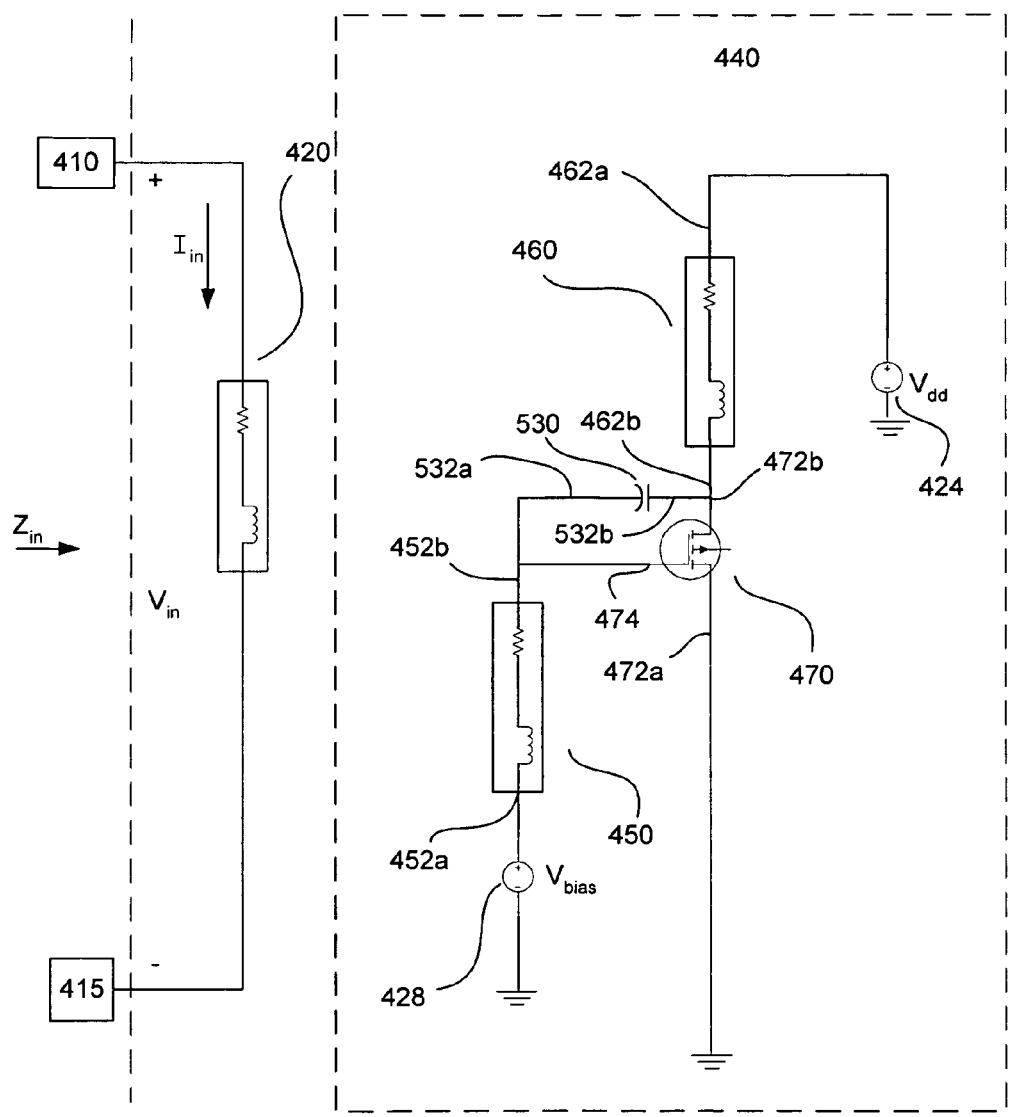
FIG. 9 shows a high Q factor circuit in accordance with another embodiment of the invention.

FIG. 9 shows a high Q inductor circuit 500 in accordance with one embodiment of the invention. The high Q inductor circuit, except for a tuner 530, is similar to that described in FIG. 4. In one embodiment, the tuner enables the frequency response or $f_{peak}$ to be adjusted or tuned to the desired frequency ($f_{des}$), which is the circuit's operating frequency. The frequency tuner, as shown, is incorporated into the compensation sub-circuit.

In one embodiment, the tuner is coupled to the VGA. The tuner, for example, changes the frequency response of $g_m$ which, in turn, controls the frequency at which the negative resistance generated by the compensation circuit is maximized. A maximum negative resistance corresponds to minimum effective resistance which leads to maximum Q. As such, the frequency at which the peak Q occurs ($f_{peak}$) can be adjusted to the desired frequency by the tuner.

The tuner, for example, comprises a capacitor ($C_{tune}$). The capacitance is selected to produce the desired frequency response of the VGA. Other types of tuning components or tuners which can provide the desired capacitance to change the $g_m$ of the VGA are also useful. For example, the frequency tuner can comprise a varactor. The capacitance of the varactor can be changed by adjusting its bias voltage. The tuner comprises first and second terminals 532a-b. One terminal is coupled to the control terminal of the VGA and the other is coupled to the second terminal of the VGA. The tuner comprises an inherent impedance $X_{ct}$.

By including the tuner, the effective impedance ($Z_{eff\,2}$) of the circuit is defined as follows:

$$Z_{eff} = X_{L1} + R_1 + sM_{31} \times \frac{BC - E}{D - AB}$$

where $$A = -\frac{sM_{32}}{X_{L2} + R_2} - \frac{X_{L3} + R_3}{X_{Ct}}$$

$$B = \left[\frac{1}{X_{Cgs}} + \frac{1}{X_{L2} + R_2} + \frac{1}{X_{Ct}}\right]^{-1} \times \left(g_m - \frac{1}{X_{Ct}}\right),$$

$$C = \frac{sM_{12}}{X_{L2} + R_2} - \frac{sM_{13}}{X_{Ct}},$$

$$D = 1 + \frac{X_{L3} + R_3}{X_{Ct}}, \text{ and}$$

$$E = \frac{1}{X_{Ct}} \times sM_{13}.$$

The desired frequency response can be obtained from:

$s=j\omega$ where $\omega=2\pi f$, and $f_{des}=\omega/(2\pi)$ in $Z_{eff\,2}$;

The peak Q frequency can be tuned to match the $f_{des}$ or the circuit's operating frequency. The peak Q frequency can be determined from the effective impedance $Z_{eff\,2}$ as follows:

$$\frac{\delta Q}{\delta f} = \frac{\delta}{\delta f}\left(\frac{\text{Im}Z_{eff\,2}}{\text{Re}Z_{eff\,2}}\right) = 0.$$

This assumes that no over compensation occurs, that is $R_1 > R_C$, and frequency is below self resonant frequency of the inductor.

Figure 10:
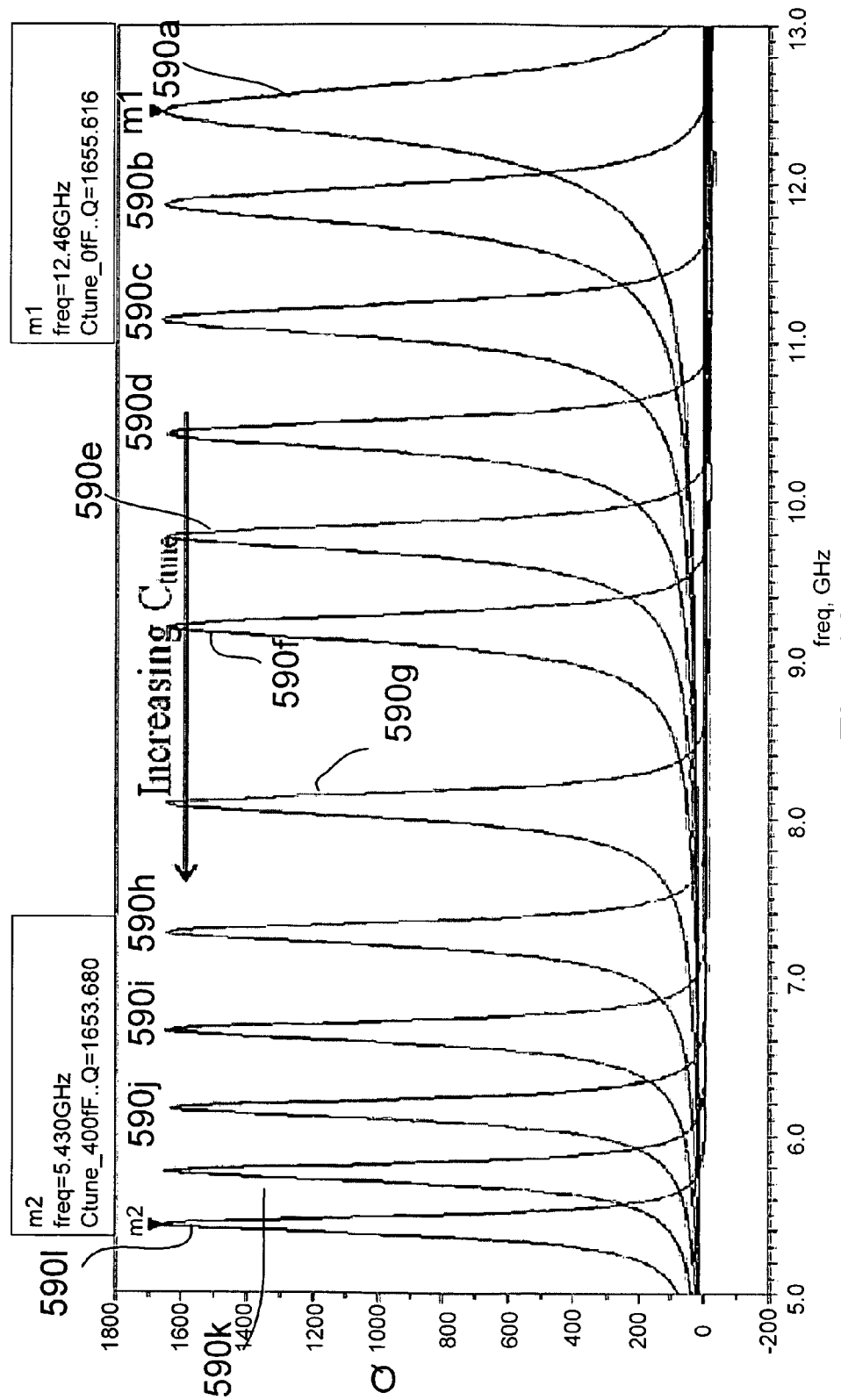
FIG. 10 shows the relationship between Q factor and frequency tuner.
Figure 11:
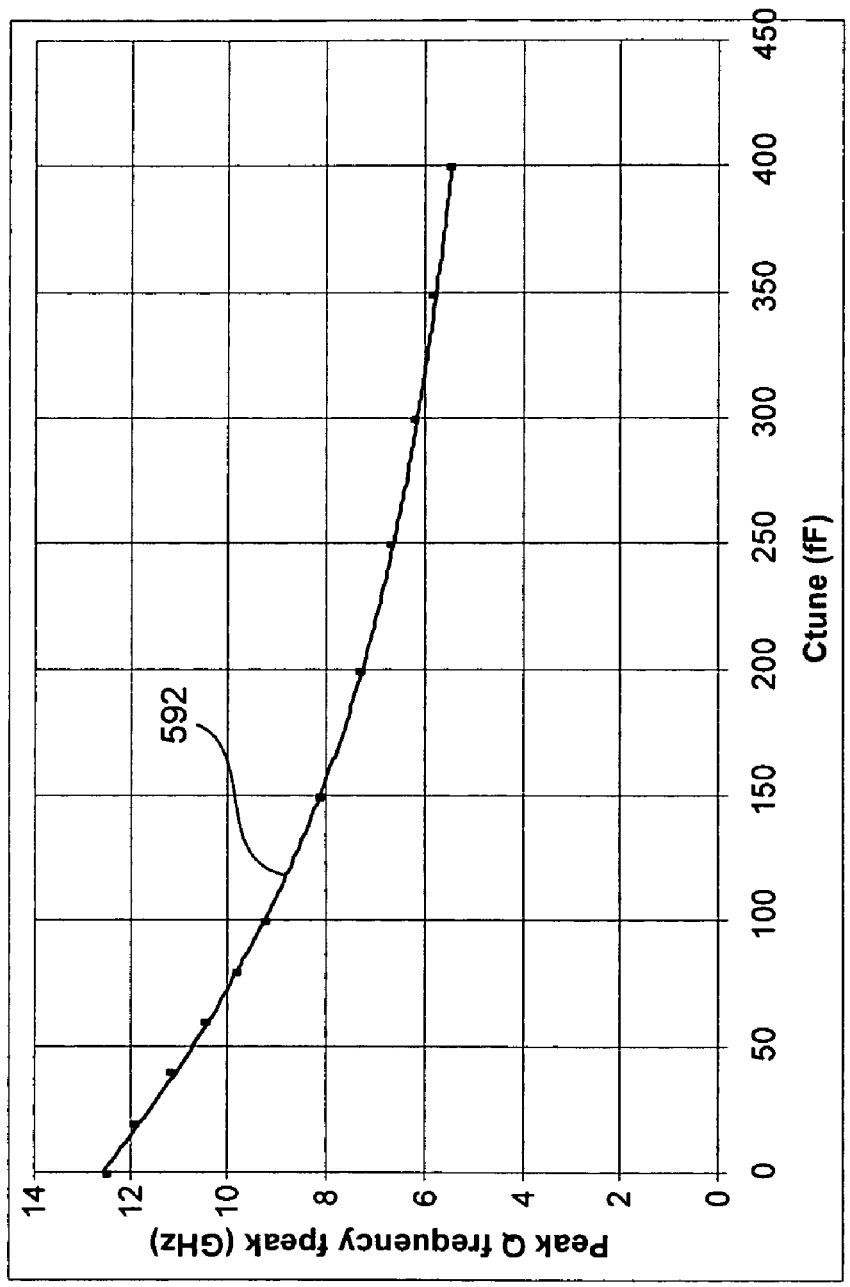
FIG. 11 shows the relationship between peak frequency $f_{peak}$ and capacitance of the tuner.

FIG. 10 shows the shifting of $f_{peak}$ based on the frequency tuner. A simulation is performed on the high Q inductor circuit. The simulation measures the Q factor as a function of frequency at a given tuning capacitance. Twelve simulations were performed with the tuner having different capacitances. Six simulations were performed starting with a tuner capacitance at 0 fF with 50 fF increments. These results are plotted as lines 590a-f. Six additional simulations were performed stating a tuner capacitance at 400 fF with 100 fF increments. These results are plotted as lines 590g-l. As shown, $f_{peak}$ is indirectly related to the capacitance of the tuner. That is, with increasing capacitance, $f_{peak}$ decreases. The maximum frequency at which $f_{peak}$ occurs is when no tuner circuit is used. This is confirmed by FIG. 11, which plots $f_{peak}$ as a function of capacitance of the tuner shown as line 592. With increasing capacitance, $f_{peak}$ decreases.

Figure 12:
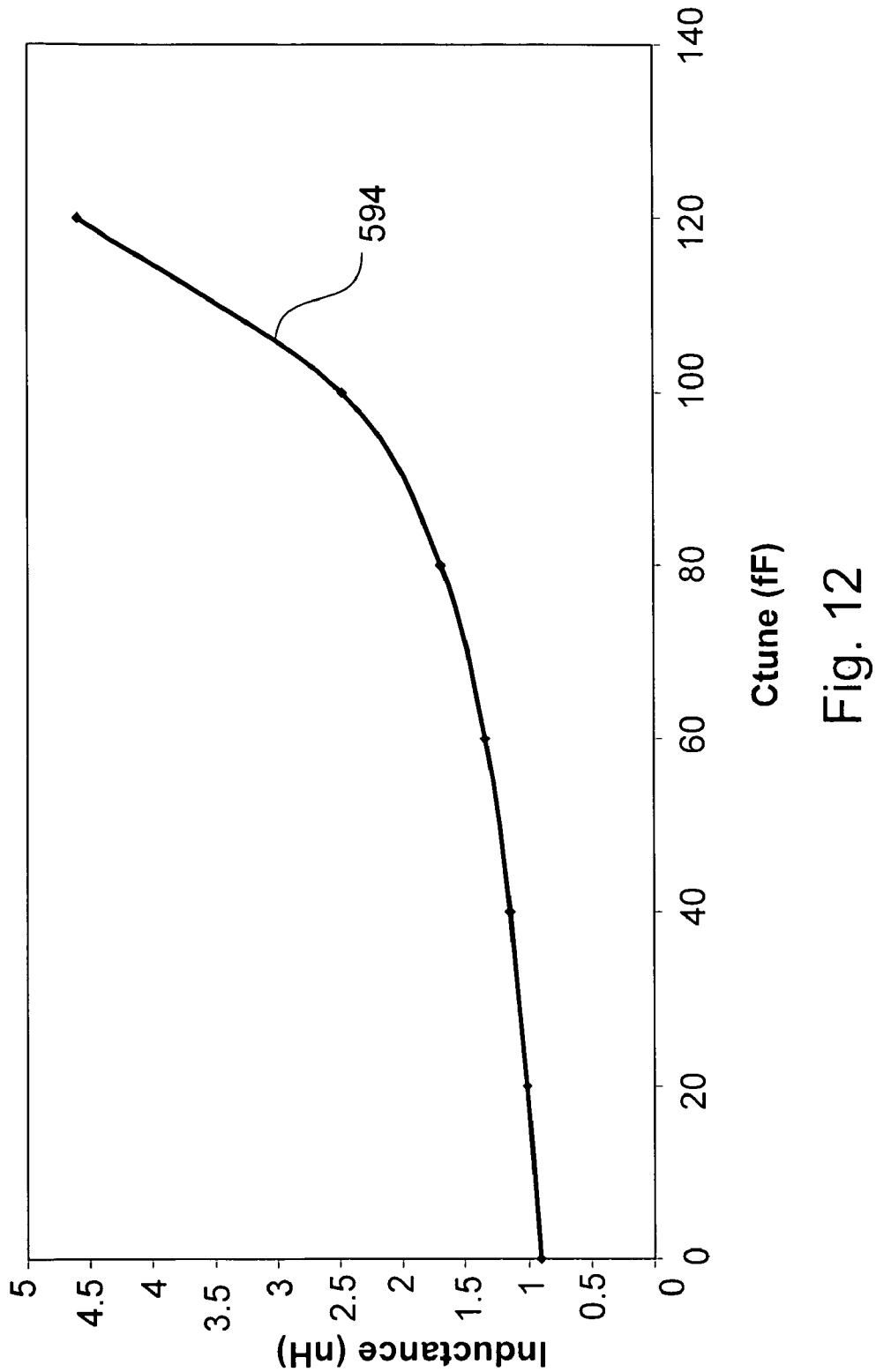
FIG. 12 shows the relationship between inductance and frequency (inductance) tuner at 9 GHz.

The capacitance of the tuner can also affect the inductance of the high Q inductor circuit. FIG. 12 plots the effective inductance of the circuit as a function of capacitance shown as line 594, with the inductance of the primary inductor being 0.51 nH. From FIG. 12, the effective inductance increases with increasing capacitance of the tuner. The inductance tunability can be determined using the following equation:

$$\frac{L_{eff} - L_1}{L_1} = \frac{4.6 - 0.51}{0.51} = 800\%$$

where $L_{eff}$ is the highest effective inductance; and
$L_1$ is the inductance of the primary inductor.
From the above equation, the effective inductance of the high Q inductor can be tuned to about 800% of the inductance of the primary inductor.

The ability to significantly increase the effective inductance can provide numerous advantages. For example, high inductance can be achieved using smaller inductors, which reduces over-all chip size and costs. In addition, the ability to precisely control the inductance of the inductor, inductance compensation can be performed to accommodate deviations due to process variations. This is particularly useful for applications requiring high frequency selectivity. Furthermore, tunable inductors can be used along with tunable capacitors to improve the tuning range of LC circuits. Such inductors can also be employed in, for example, LC circuits.

Figure 13:
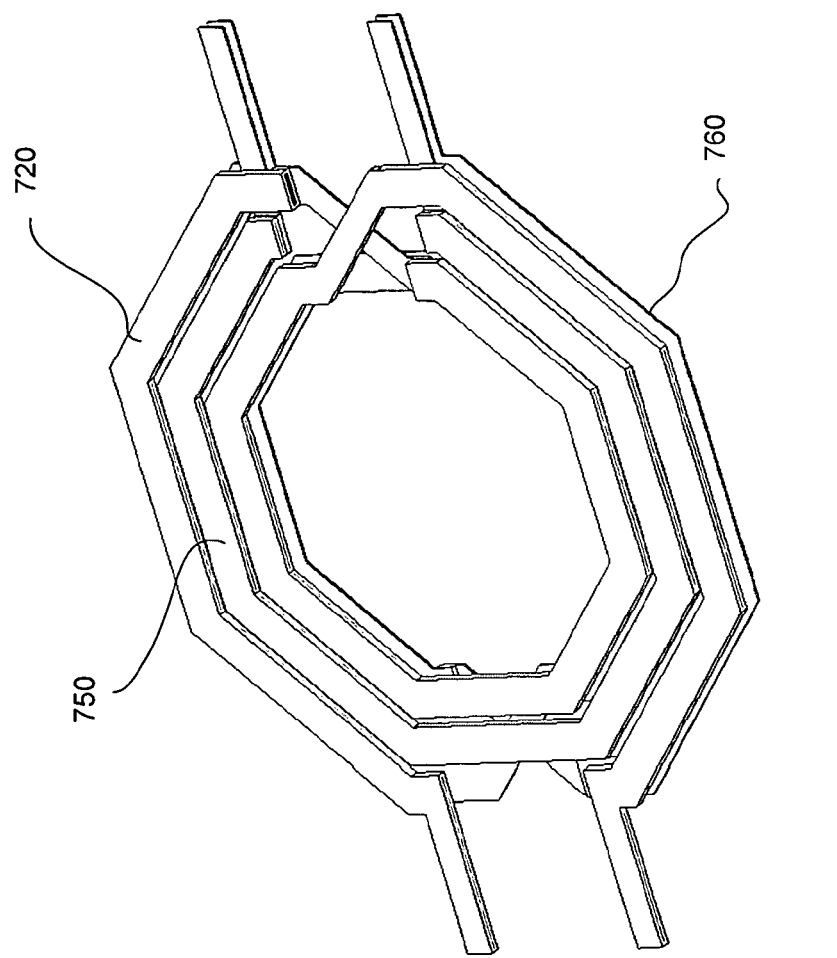
FIG. 13 shows a layout of a high Q inductor circuit in accordance with one embodiment of the invention.

FIG. 13 shows an on-chip high Q inductor circuit layout 700 in accordance with one embodiment of the invention. The inductor circuit comprises first (primary), second (sensing) and third (feedback) inductors 720, 750 and 760, corresponding to the primary, first and second compensation inductors of FIG. 4 or 5. Preferably, the inductor circuit comprises an octagonal shape. Other geometric shapes are also useful. The inductor circuit is typically formed on a dielectric layer over a substrate, such as a silicon substrate (not shown). Other types of substrates are also useful. The dielectric layer, for example, can be metal layers in an IC. The dielectric can be any metal layers in the IC.

In one embodiment, the first and second inductors are interleaved while the third inductor is stacked with the first inductor. Interleaving the first and second inductors produces a moderate coupling factor $k_{12}$, for example, about 0.6-0.8. Stacking the first and third inductors produces a high coupling factor $k_{13}$, for example, >0.9. Furthermore, the second and third inductors have a low coupling factor $k_{23}$, for example, <0.2. The moderate mutual coupling between the first and second inductors and low mutual coupling between the second and third inductors improve the linearity or dynamic range of the high Q inductor. The high coupling factor between the first and third inductors facilitates lower power consumption for generating the negative resistance for compensation.

Figure 14A:
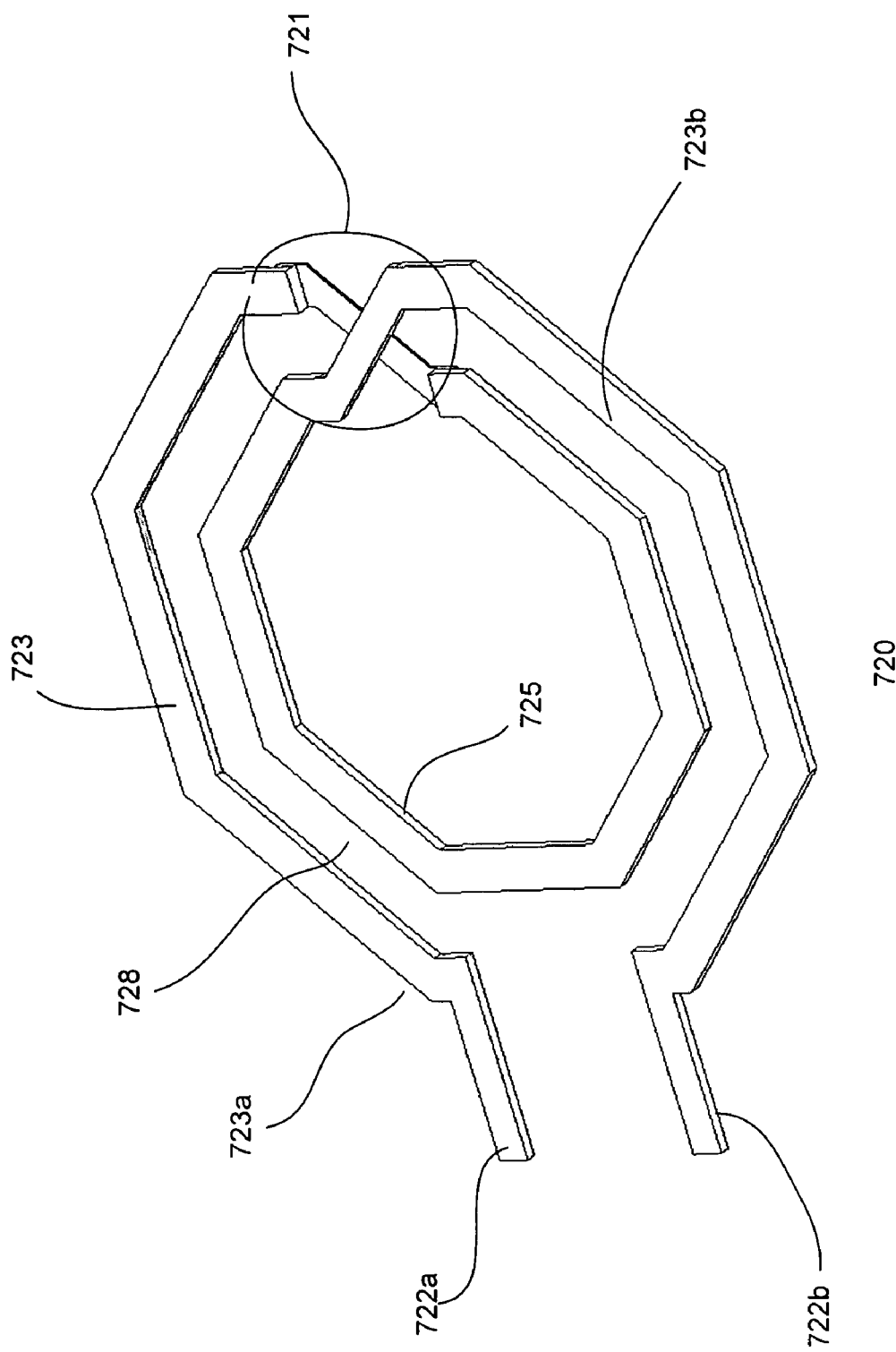
Figure 14C:
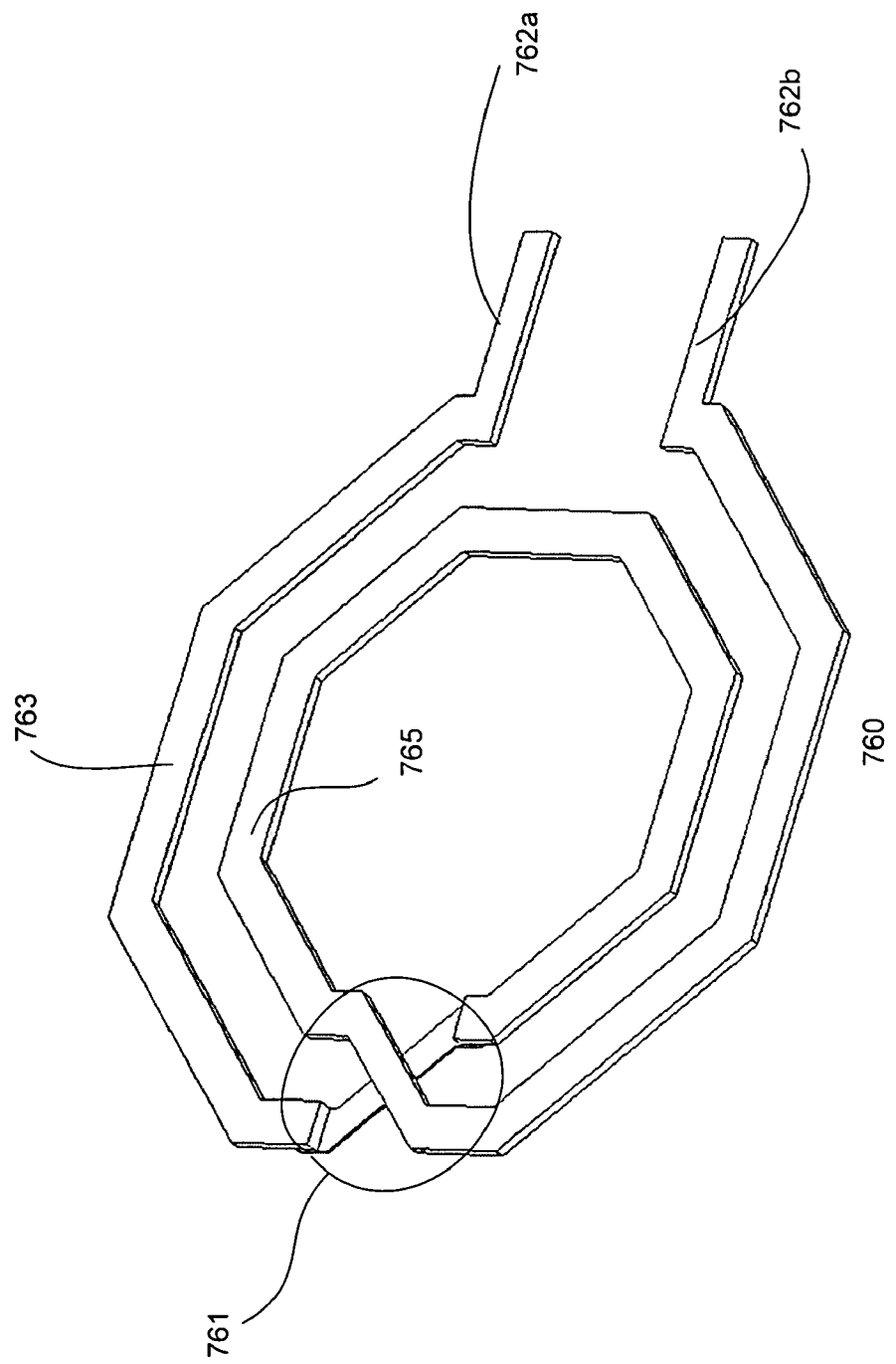

FIGS. 14a-c shows first, second and third inductors in accordance with one embodiment of invention. Referring to FIG. 14a, a first or primary inductor 720. The primary inductor is formed on a primary plane of a dielectric layer. The first inductor comprises metal trace forming first and second continuous concentric loops 723 and 725. The loops comprise the geometric shape of the inductor circuit. The loops are separated by an interloop spacing 728. Preferably, the spacing is constant in width.

In one embodiment, the outer loop comprises first and second segments 723a-b. The first and second segments are preferably about the same length. Forming first and second segments having unequal lengths are also useful. The inner loop comprises first and second end, forming an open loop. First and second terminals 722a-b of the first inductor are coupled to first ends of the outer segments The second ends of the outer inductor segments are coupled to first and second ends of the inner loop via a cross-over coupling 721. The first ends are located on a first portion of the inductor circuit while the second ends are located on a second portion. Preferably, the first and second portions are opposite portions of the inductor circuit.

The cross-over coupling, for example, is provided on a different plane of the dielectric layer than loops of primary inductor. For example, the cross-over coupling is provided on a plane below the primary inductor. Forming the cross-over coupling in a plane above the primary inductor is also useful.

Figure 15A:
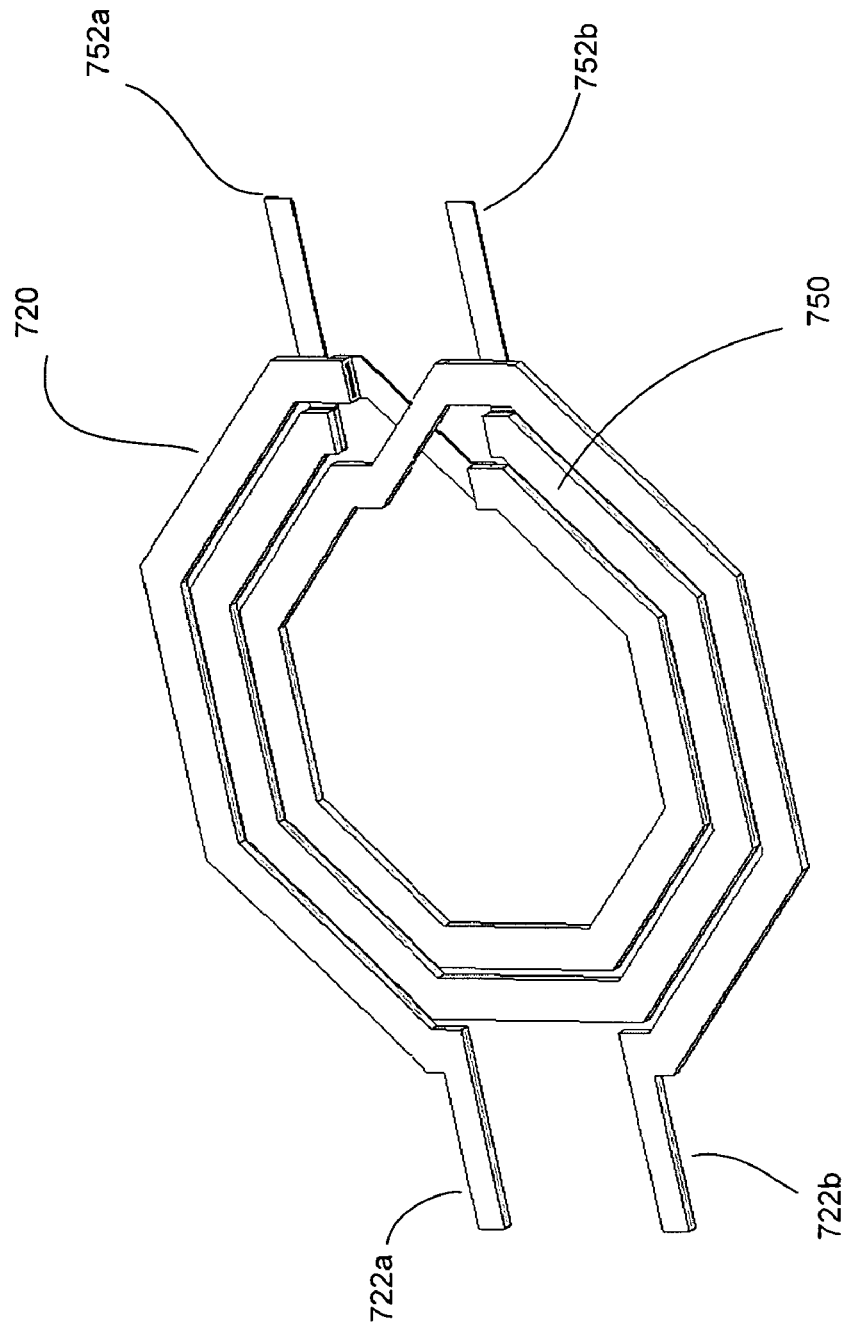
FIGS. 15a-b show layout of first and second inductors and first and third inductors respectively in accordance with one embodiment of the invention.

Referring to FIG. 14b, a second inductor 750 is shown. The second inductor comprises an open loop having first and second ends. First and second terminals 752a and 752b of the second inductor are coupled to first and second ends of the second inductor. The first and second ends are located on a second portion of the loop. In one embodiment, the second inductor is disposed within the same plane as the first inductor. In one embodiment, the second inductor is configured to fit within the spacing between the outer and inner loops and in the same plane of the first inductor, as shown in FIG. 15a. Preferably, the terminals of the second inductor are located at a portion of the inductor circuit which corresponds to the cross-over coupling of the first inductor. The second inductor is inductively coupled to the inner and outer loops of the first inductor in the same plane.

Figure 15B:
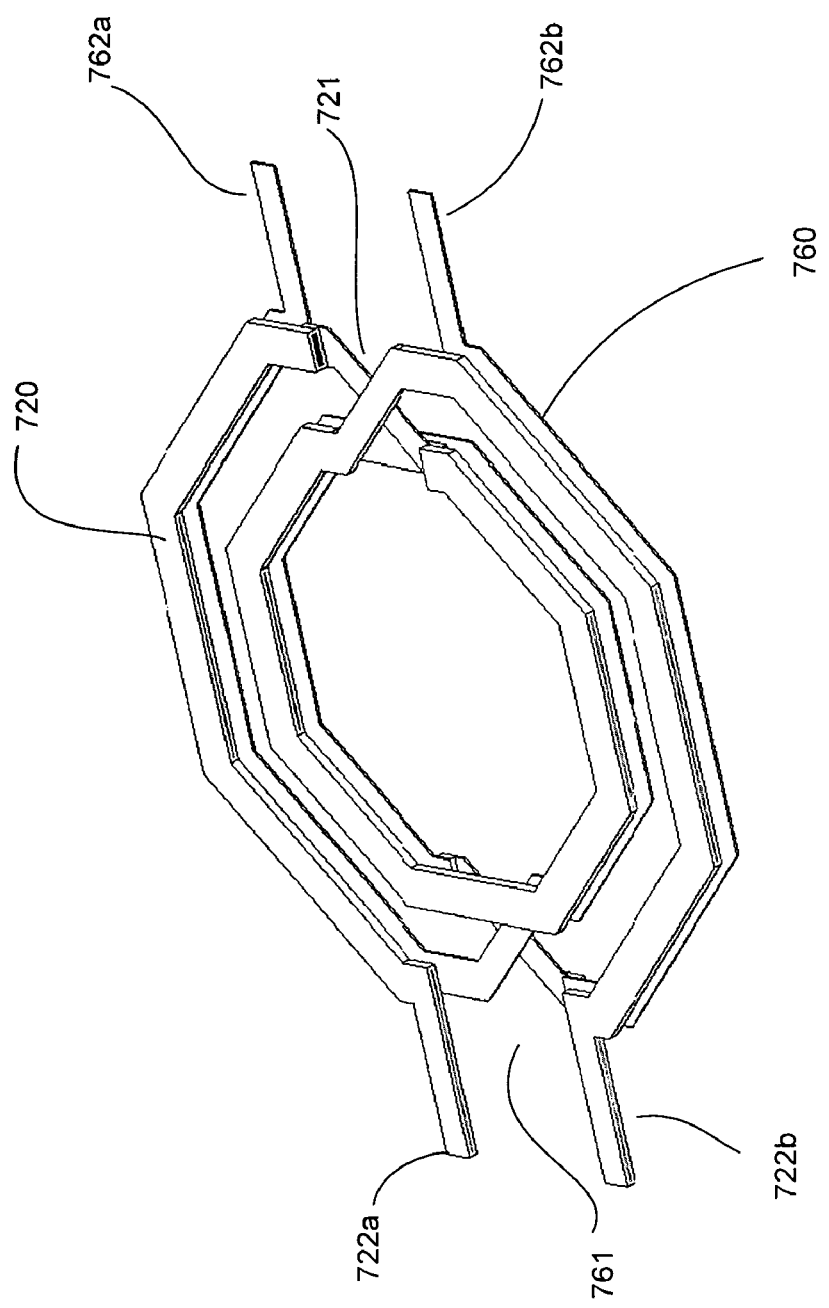
Figure 16A:
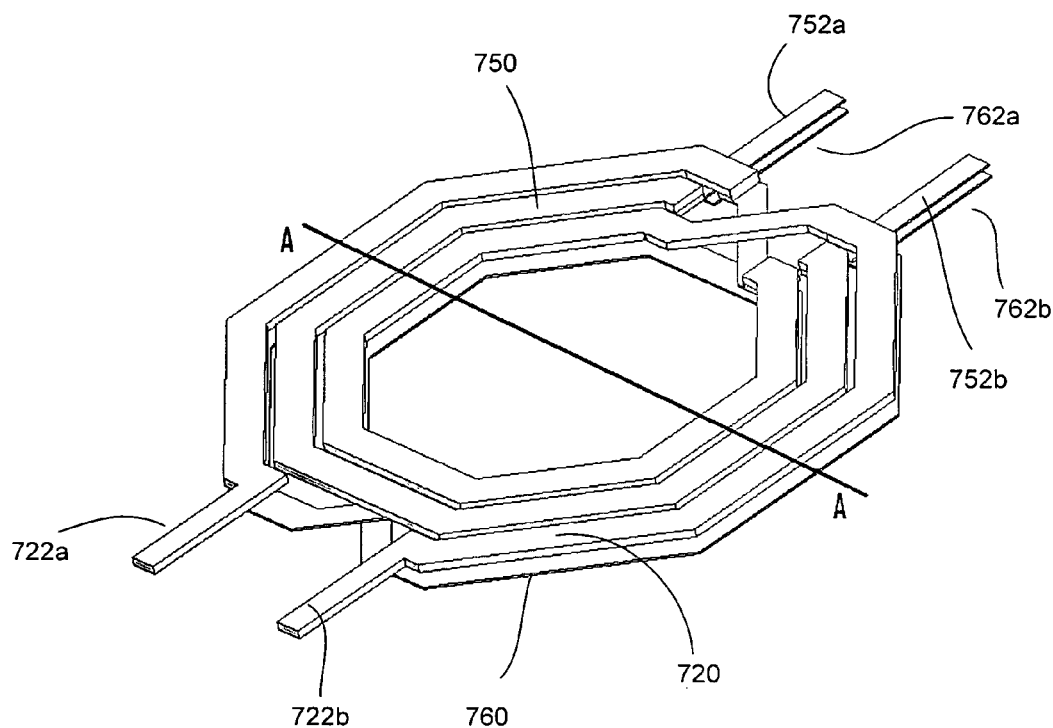
FIGS. 16a-d show various views of a layout of a high Q inductor in accordance with one embodiment of the invention.
Figure 16B:
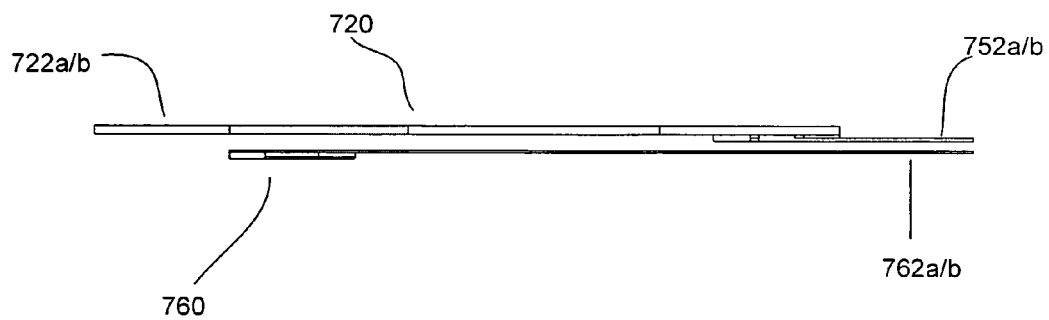
Figure 16C:
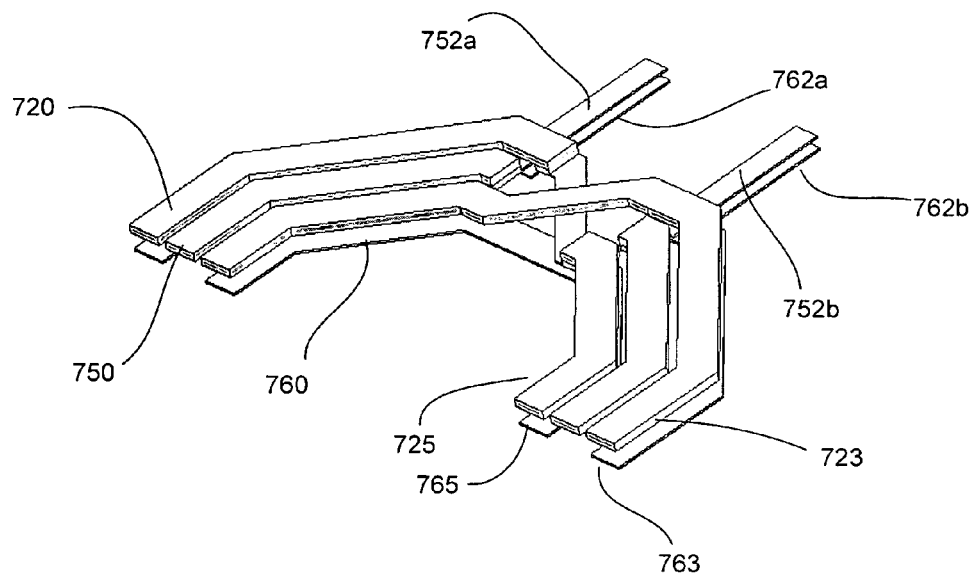
Figure 16D:
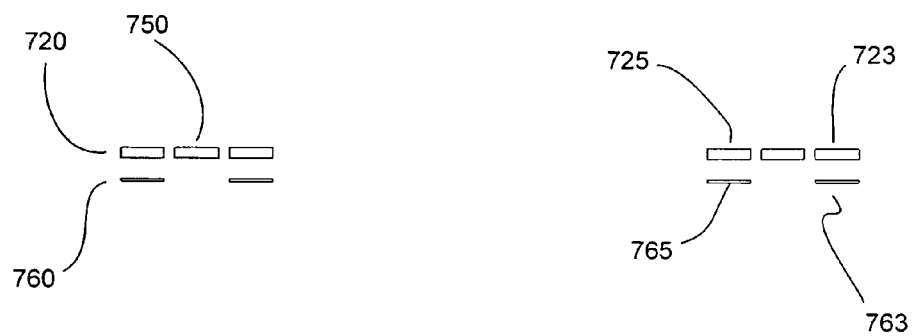

FIG. 14c shows a third inductor 760. In one embodiment, the third inductor is essentially the same as the first inductor. The first and third inductors are stacked on different planes, with cross-over couplings 761 and terminals 762a and 762b at opposite portions of the inductor circuit, as shown in FIG. 15b. The third inductor, similar to the first inductor, also comprises metal trace forming first and second continuous concentric loops 763 and 765. The first and third inductors have mutual coupling on different planes.

FIGS. 16a-d show various views of a high Q inductor circuit layout in accordance with one embodiment, of the invention. The first and second inductors 720 and 750 are interleaved on the same plane while the first and third inductors are stacked on different planes. This configuration produces a moderate coupling between the first and second inductors, a high coupling between the first and third inductors and a low coupling between the second and third inductors, which reduces power consumption and improves linearity or the dynamic range of the high Q inductor.

Figure 17:
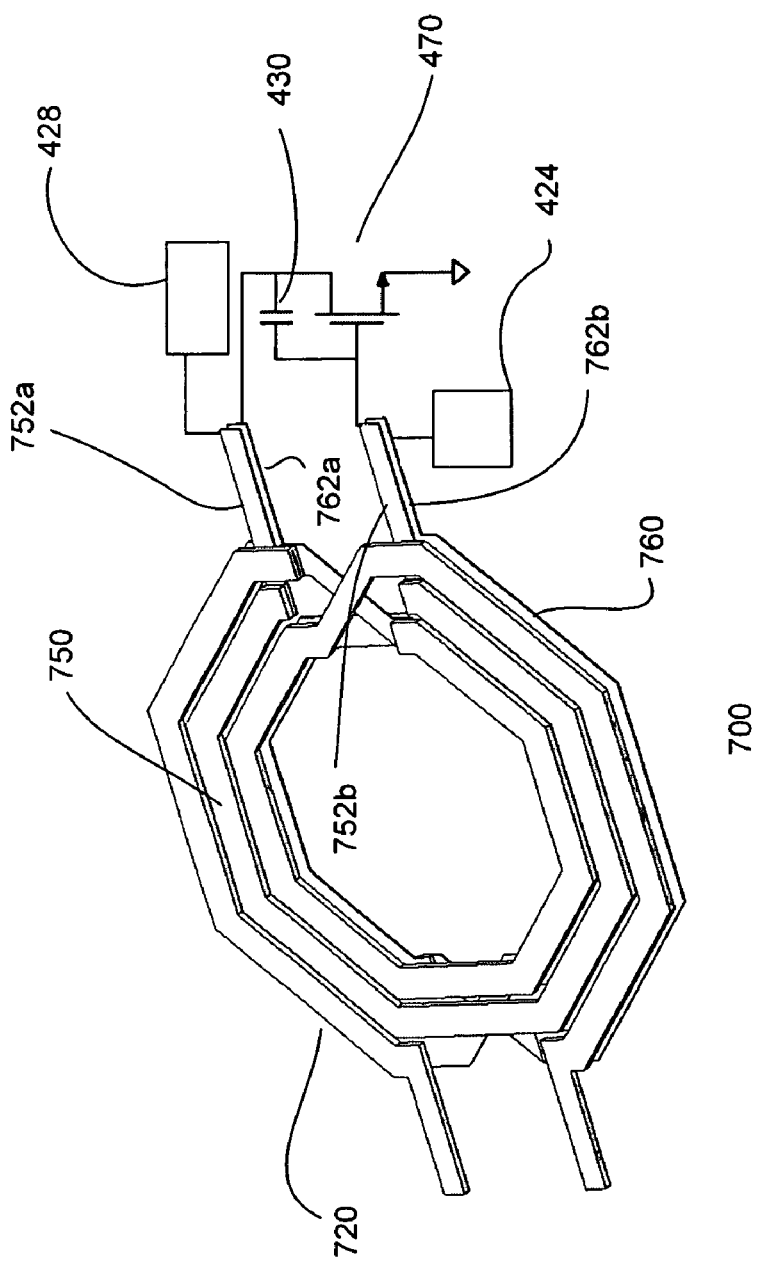
FIG. 17 shows a layout for forming a high Q inductor in accordance with yet another embodiment of the invention.

FIG. 17 shows a high Q inductor layout 700 with connections to form the inductor circuit. In one embodiment, a bias voltage 428 is coupled to a first terminal of the second or sensing inductor 750. The second terminal 752b is coupled to control terminal of the transistor which forms the VGA 470. A first terminal of the transistor is coupled to ground while the second terminal is coupled to a first terminal of the third or feed back inductor 760. The second terminal of the third inductor is coupled to an operating voltage ($V_{dd}$) 424. A tuner 430 is coupled between the control and second terminals of the VGA.

Figure 18:
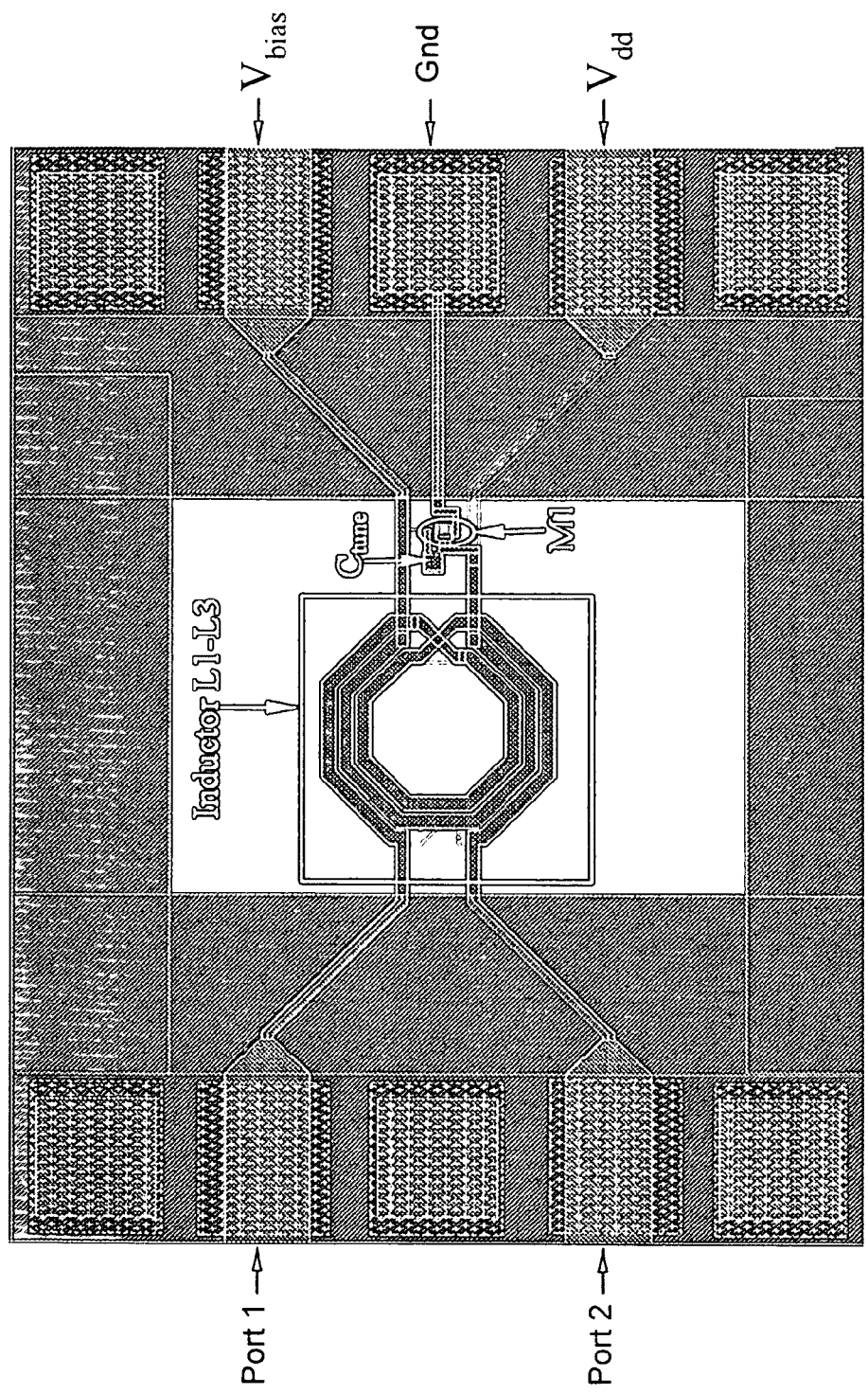
FIG. 18 shows a tape out image of a high Q inductor in accordance with one embodiment of the invention.

FIG. 18 shows a screenshot of a high Q inductor structure in accordance with one embodiment of the invention As shown, the high Q inductor comprises first (primary), second (sensing) and third (feedback) inductors interleaved and stacked on a substrate. A second terminal of the feedback inductor is coupled to a first pad which is coupled to $V_{dd}$. A first terminal of the sensing inductor is coupled to a second pad which is coupled to $V_{bias}$. A transistor which forms the VGA includes control, first and second terminals. The control terminal is coupled to the second terminal of the sensing inductor. The first terminal is coupled to a third pad which is coupled to ground. The second terminal is coupled to the first terminal of the feedback inductor. A tuning capacitor is provided between the control and second terminals of the VGA.

Figure 19:
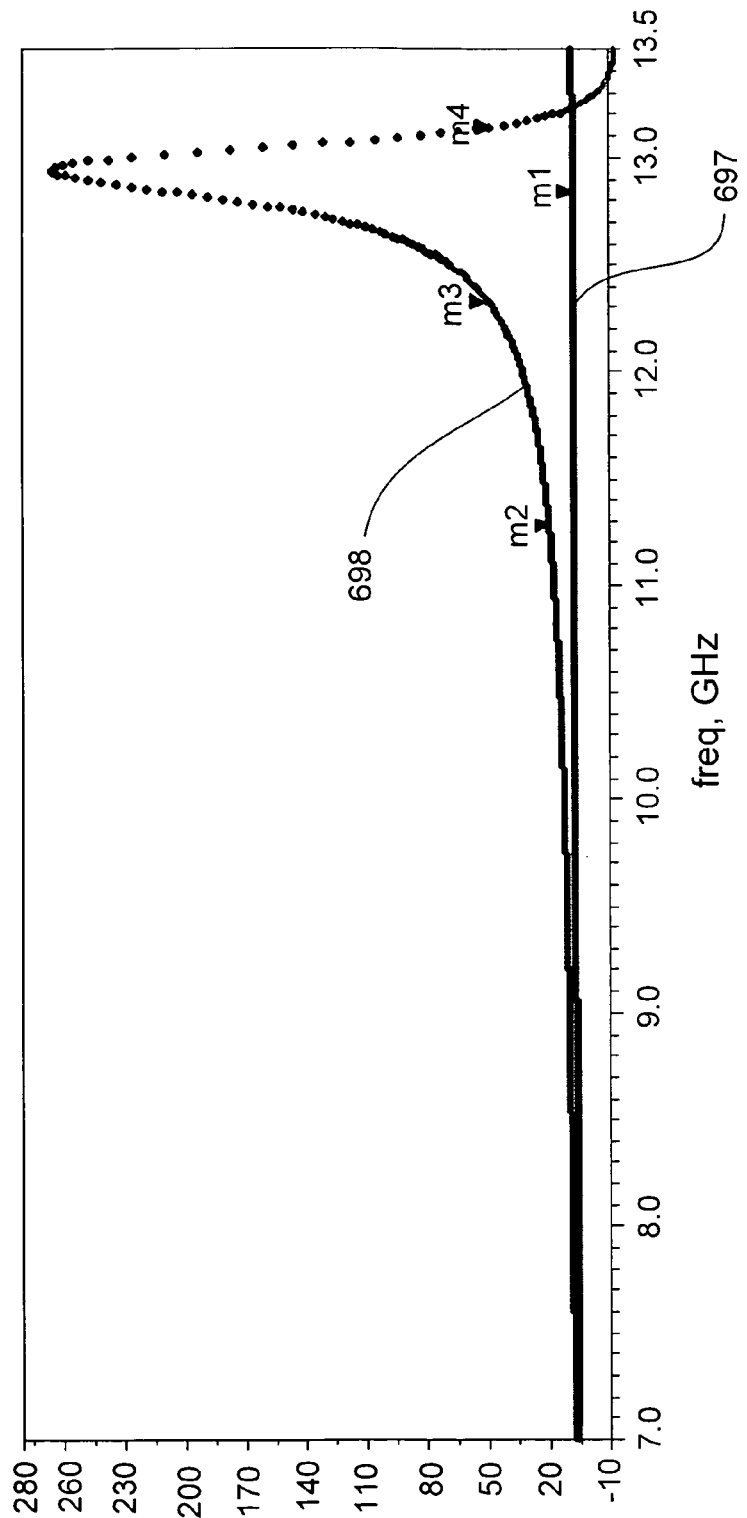
FIG. 19 compares Q enhancement of a high Q inductor and conventional inductor.

A simulation was conducted to compare the Q factors of a conventional inductor with that of a high Q inductor in accordance with one embodiment of the invention as a function of frequency. FIG. 19 plots the simulation results. Line 698 represents data corresponding to the high Q inductor and line 697 represents data corresponding to the conventional inductor. As for the conventional inductor, the Q factor is relatively constant at about 9 from about 7-13.5 GHz. At a frequency of 12.84 GHz (m1), Q is about 8.4. However, the high Q inductor has a change in Q factor over the frequency range. At a frequency of 11.28 GHz (m2), the high Q inductor has a Q factor of 20. As the frequency increases to 12.33 GHz (m3), the Q factor is about 50. At a frequency of 13.14 (m4), the Q factor is about 48.4. This illustrates that the high Q inductor has tunable Q factor with a wide bandwidth. Higher Q factors and wider bandwidth can also be achieved with additional tuning.

Figure 20:
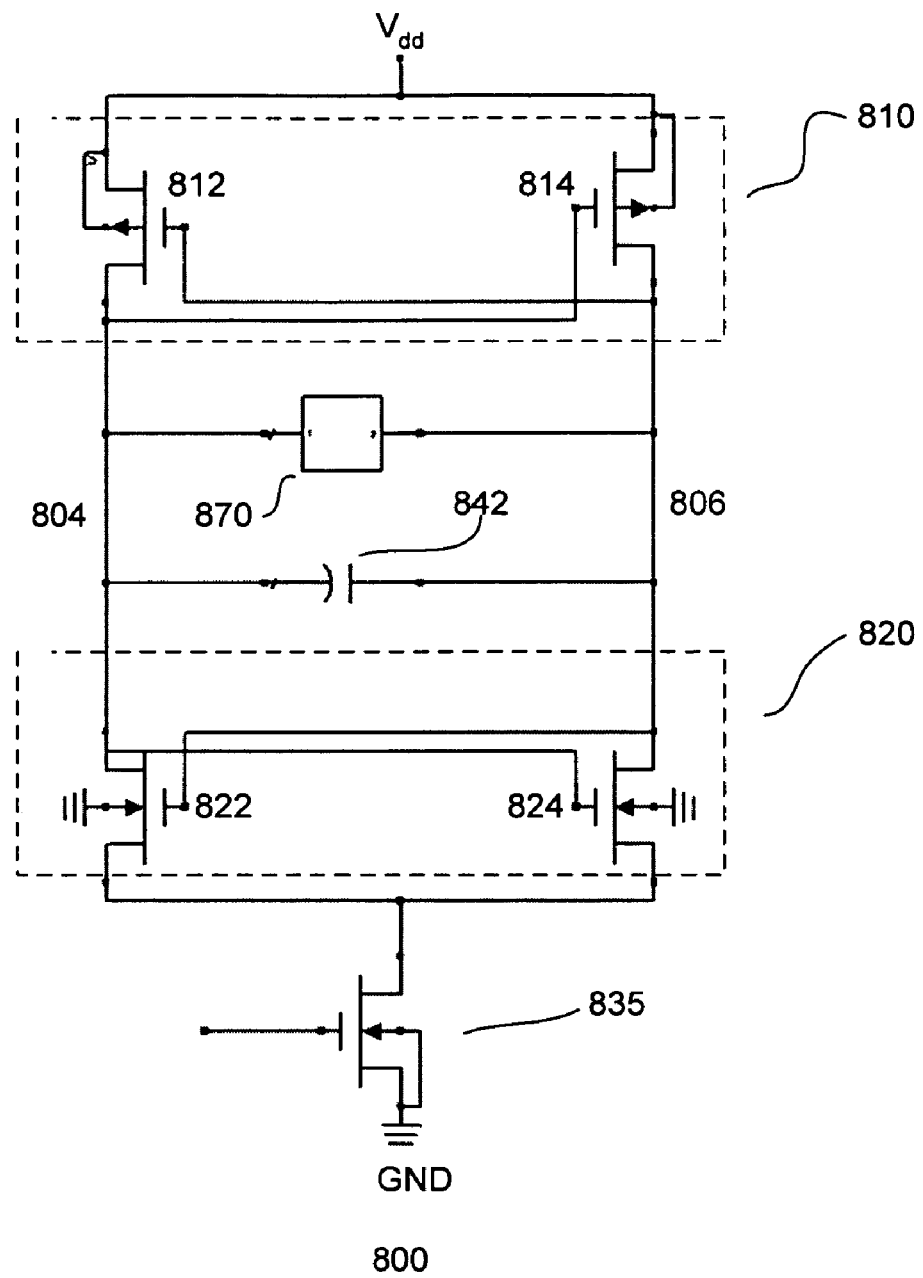
FIG. 20 shows a VCO in accordance with one embodiment of the invention.

FIG. 20 shows a voltage controlled oscillator (VCO) circuit 800 in accordance with one embodiment of the invention. The VCO, as shown, comprises first and second transistor pairs 810 and 820 coupled in series to form two parallel circuit paths 804 and 806. Transistors 812 and 814 of the first transistor pair are cross-coupled; transistors 822 and 824 of the second transistor pair are cross-coupled. Located between the transistor pairs and coupled to the first and second circuit paths are a capacitor 842 and an inductor 870. First ends of the circuit path are coupled to voltage source $V_{dd}$. Second ends are coupled to ground via a transistor 835. In one embodiment, the inductor comprises a high Q inductor as described in FIG. 4 or 9. The high Q inductor can also be incorporated into other types of VCOs.

Figure 21A:
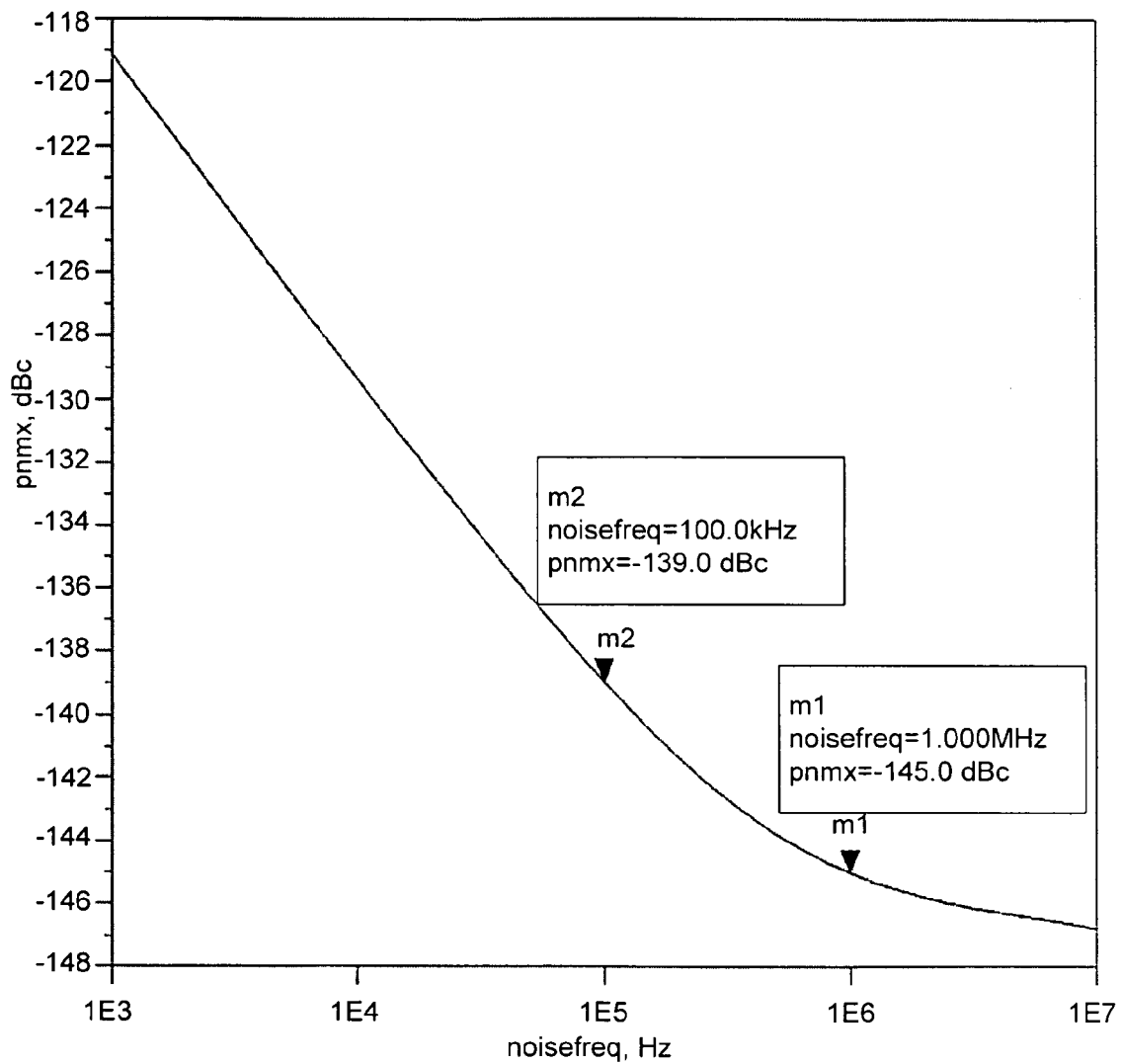
FIGS. 21a-b plot phase noise as a function of noise frequency of a conventional VCO and high Q VCO in accordance with one embodiment of the invention.
Figure 21B:
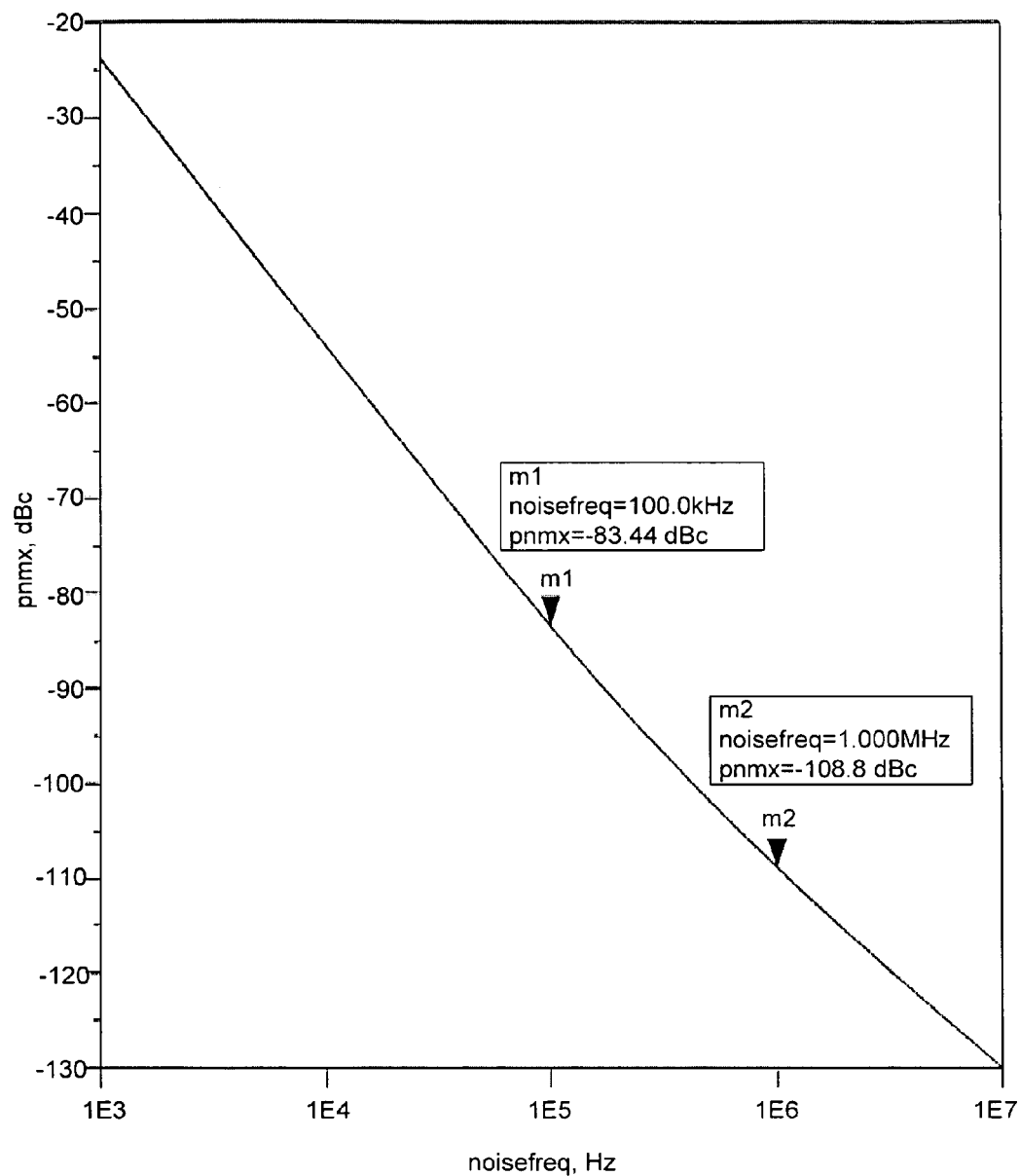

A performance analysis of the high Q inductor VCO and conventional VCO was conducted. The simulation parameters are as follows:
frequency=5 GHz;
$V_{dd}$=1.8V; and
$V_{swing}$=1.8 V
Results of the simulations are plotted in FIGS. 21a-b, with FIG. 21a corresponding to the high Q inductor VCO and FIG. 21b corresponding to the conventional VCO. From FIG. 21a, the high Q inductor VCO has a phase noise (PN) at 1 MHz equal to −145 dBc. The total current $i_{total}$ of the circuit is about 0.9 mA and a total power $P_{total}$ consumed by the circuit is of about 0.9 mW. As shown from FIG. 21b, the conventional VCO has a PN at 1 MHz equal to −108.8 dBc. The total current $i_{total}$ of the circuit is about 3.5 mA and a total power $P_{total}$ consumed by the circuit is of about 6.3 mW. From the simulation results, the high Q inductor VCO has over 85% power savings and 36.2 dBc PN improvement over the conventional VCO.

Figure 22:
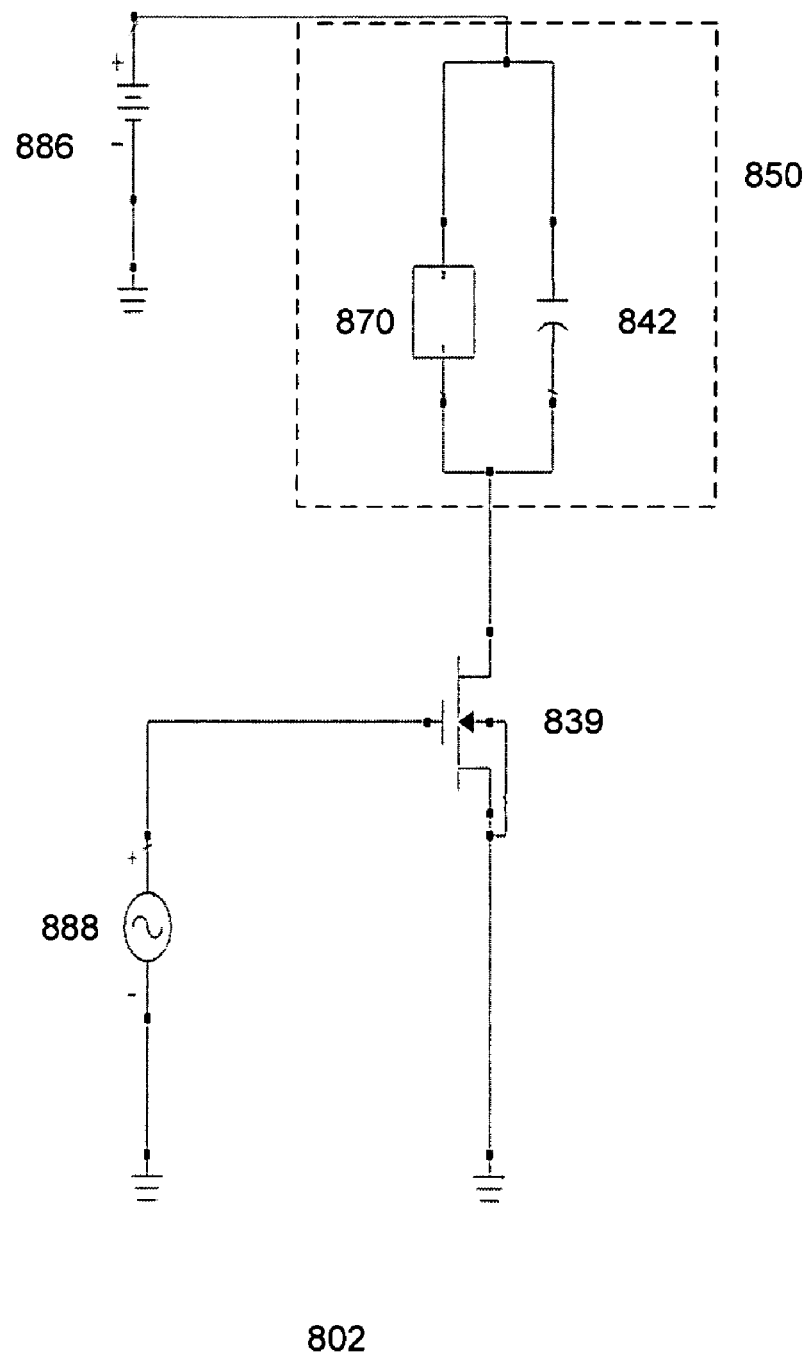
FIG. 22 shows a filter in accordance with one embodiment of the invention.

FIG. 22 shows a channel selection filter (CSF) or a bandpass filter circuit 802 in accordance with one embodiment of the invention. The CSF, as shown, comprises a filter sub-circuit 850. The filter sub-circuit includes first and second terminals with a high Q inductor 870 and capacitor 842 coupled in parallel. One terminal of the filter sub-circuit is coupled to a DC voltage source 886. The other terminal of the filter sub-circuit is coupled to ground via a transistor 839. The gate of the transistor is coupled to AC voltage source 888. In one embodiment, the high Q inductor can be those described in FIG. 4 or 9. The high Q inductor can also be incorporated into other types of CSFs.

Figure 23:
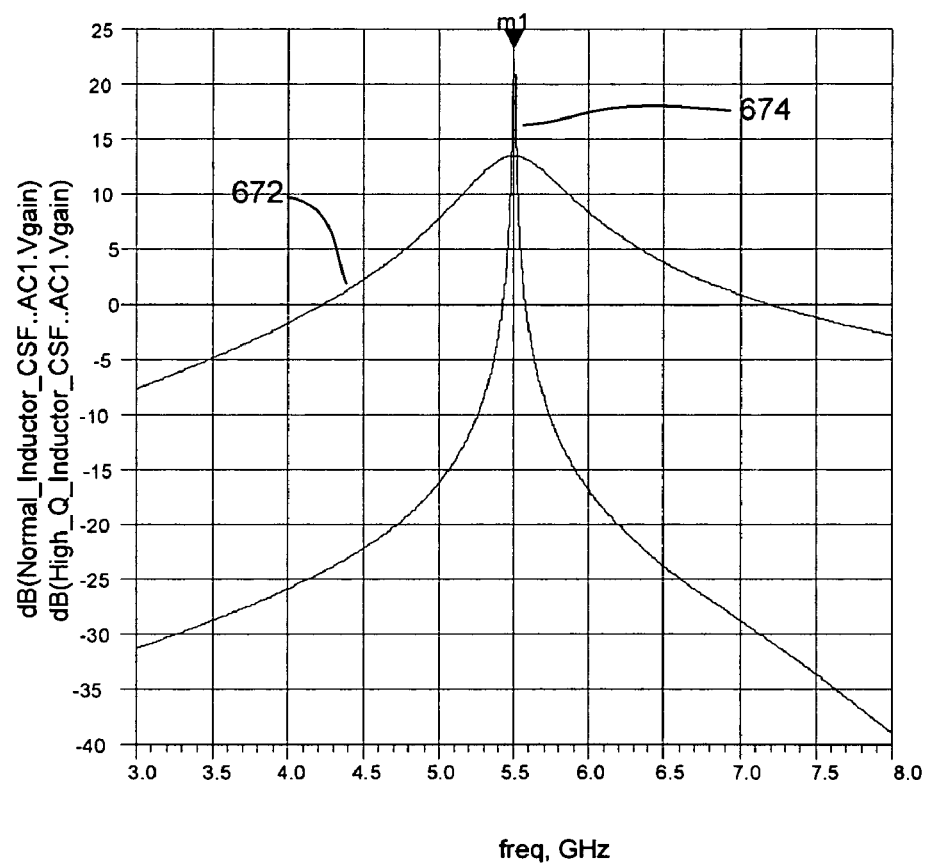
FIG. 23 compares the performance of a conventional filter with a high Q filter in accordance with one embodiment of the invention.

A simulation was conducted to compare the performance of a CSF with high Q inductor against that of a conventional CSF. FIG. 23 plots the noise performance as a function of frequency. Line 672 corresponds the data of the conventional CSF while line 674 corresponds to the data of the CSF with a high Q inductor. Table 2 compares the frequency tunability selectivity of CSF with and without the high Q inductor.

TABLE 2

| | 3-dB bandwidth | Selectivity |
|---|---|---|
| Normal Inductor | 647 MHz | 8.5 |
| High-Q Inductor | 8 MHz | 687.5 |

Clearly, by providing a CSF with a high Q inductor, improved frequency tunability is achieved.

Figure 24:
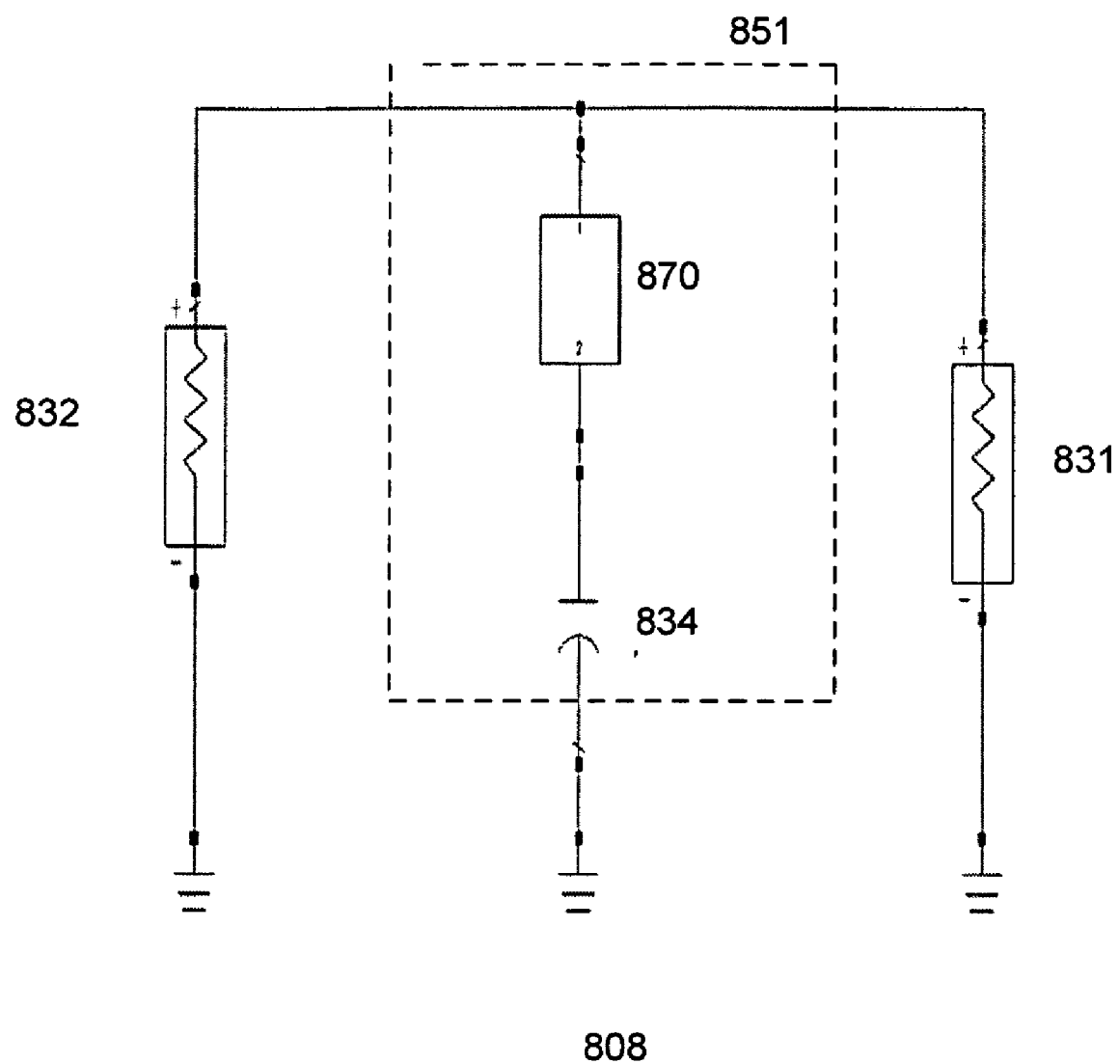
FIG. 24 shows an image rejection notch filter in accordance with one embodiment of the invention.

FIG. 24 shows an image rejection notch (IRN) filter circuit 808 in accordance with one embodiment of the invention. The IRN filter, as shown, comprises a filter sub-circuit 851. The filter sub-circuit includes first and second terminals with a high Q inductor 870 and capacitor 834 coupled in series. One terminal of the filter sub-circuit is coupled to ground. First and second resistors 831 and 832 are coupled in parallel to the other terminal of the filter circuit and to ground. In one embodiment, the high Q inductor can be those described in FIG. 4 or 9. The high Q inductor can also be incorporated into other types of notch filters.

Figure 25:
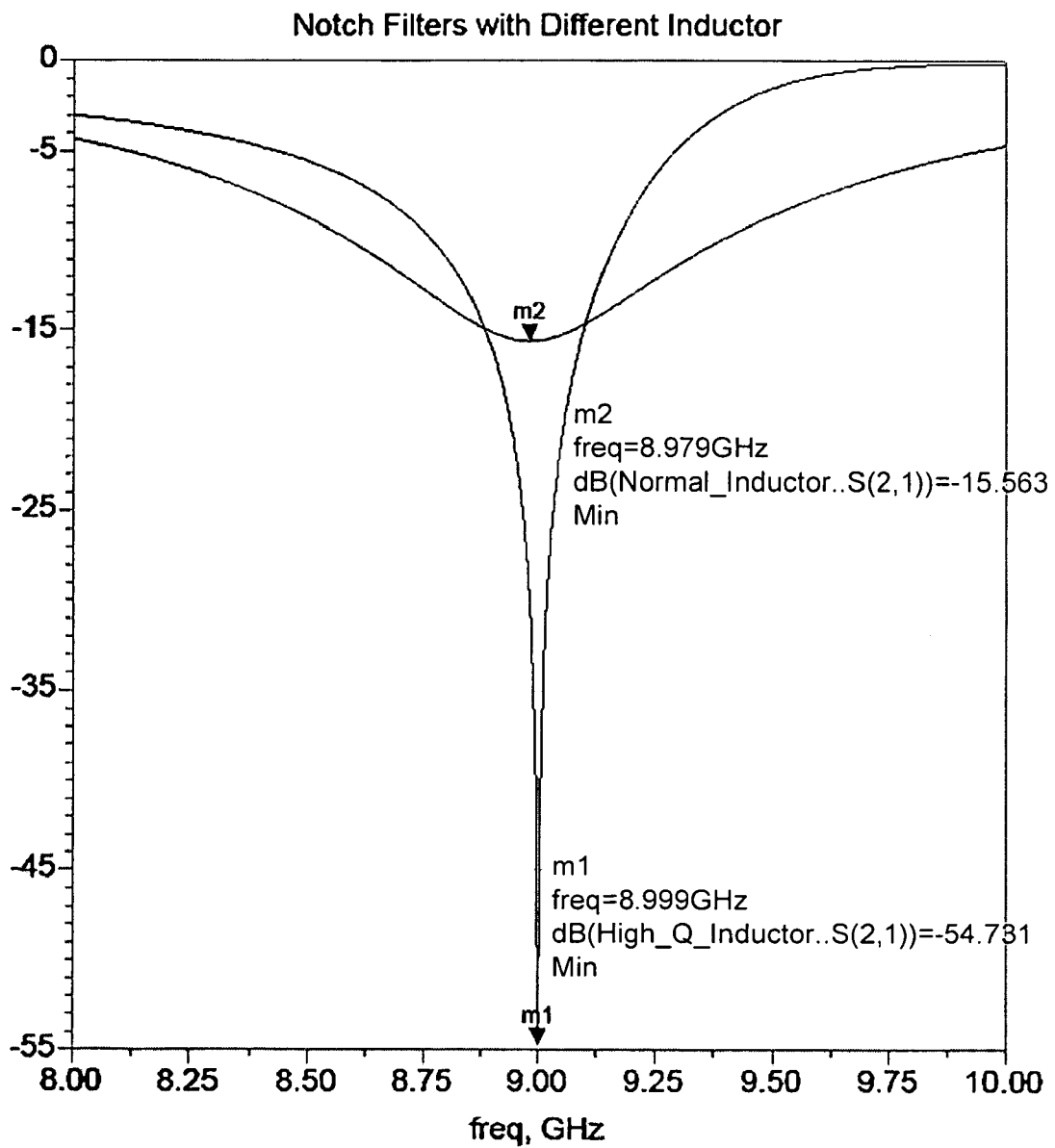
FIG. 25 compares the performance of a conventional notch filter with a high Q notch filter in accordance with one embodiment of the invention.

FIG. 25 compares the performance of IRN filter with a high Q inductor versus a convention IRN filter. Line 893 corresponds to the conventional IRN filter while line 897 corresponds to the IRN filter with a high Q inductor. As illustrated by the plot, providing a high Q inductor improves image attenuation by about 40 dB.

It is understood that in the various embodiments or applications of the inductor circuit, additional elements or circuitry can be added. For example, input and output matching circuitry and buffers can be included as desired for specific applications.

Furthermore, the invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come with the meaning and range of equivalency of the claims are intended to be embraced therein.

What is claimed is:

1. An inductor circuit comprising:
   a primary inductor sub-circuit having a primary inductor ($L_1$); and
   a compensation sub-circuit having a secondary inductor ($L_S$), the compensation sub-circuit is electrically isolated from the primary inductor, the compensation sub-circuit is magnetically coupled with the primary inductor sub-circuit to provide an inductive feedback loop for compensating loss in the primary inductor to enhance Q factor of the inductor circuit, wherein the primary inductor comprises a loss corresponding to series resistance $R_1$ and the compensation sub-circuit generates a negative resistance $R_{neg}$ to compensate for the loss $R_1$, wherein the magnitude of $R_{neg}$ is at least within 90-95% of $R_1$ to enhance the Q factor of the inductor circuit.

2. The inductor circuit of claim 1 wherein the magnitude of $R_{neg}$ is about equal to $R_1$ to enhance the Q factor of the inductor circuit.

3. The inductor circuit of claim 1 wherein:
   $L_S$ comprises first and second compensation inductors; and
   the magnitude of $R_{neg}$ is equal to $\omega^2 M_{12} M_{31} * g_m$, wherein $M_{12}$ is the mutual inductance between the primary inductor and the first compensation inductor, $M_{31}$ is the mutual inductance between the second compensation inductor and the primary inductor, and $g_m$ is the transconductance of an amplifier in the compensation sub-circuit.

4. The inductor circuit of claim 1 wherein the compensation sub-circuit comprises a bias voltage for biasing the compensation sub-circuit to adjust the amount of loss compensation, wherein the biasing of the compensation sub-circuit is independent of the primary inductor.

5. The inductor circuit of claim 1 wherein the compensation sub-circuit comprises:
   $L_S$ including a first compensation inductor ($L_2$) having first and second terminals and a second compensation inductor ($L_3$) having first and second terminals;
   an amplifier having a transconductance $g_m$, the amplifier includes a control terminal and first and second terminals, wherein the control terminal of the amplifier is coupled to the second $L_1$ terminal and the first terminal of the amplifier is coupled to the second $L_2$ terminal;
   a bias voltage coupled to the first $L_1$ terminal;
   an operating voltage source coupled to the first $L_2$ terminal of the second compensation inductor; and
   a ground coupled to the second terminal of the amplifier.

6. The inductor circuit of claim 5 wherein a magnitude of $g_m$ is tuned by adjusting the bias voltage to adjust the amount of loss compensation.

7. The inductor circuit of claim 5 wherein the amplifier comprises a variable gain amplifier comprising a transistor with a gate and first and second terminals, the gate is coupled to the control terminal of the amplifier and first and second diffusion regions are coupled to the first and second terminals of the amplifier, wherein the magnitude of $g_m$ is tuned by adjusting the bias voltage to adjust the amount of loss compensation.

8. The inductor circuit of claim 1 wherein the compensation circuit comprises a tuner to tune the frequency response of $g_m$ of an amplifier.

9. The inductor circuit of claim 1 wherein the compensation circuit comprises a tuner having first and second tuner terminals, the first tuner terminal is coupled to a control terminal of an amplifier and the second tuner terminal is coupled to a first terminal of the amplifier, the tuner comprises a capacitor to tune the frequency response of $g_m$ of the amplifier.

10. The inductor circuit of claim 1 wherein the compensation circuit comprises a tuner having first and second tuner terminals, the first tuner terminal is coupled to a control terminal of an amplifier and the second tuner terminal is coupled to a first terminal of the amplifier, the tuner comprises a varactor having a bias voltage to adjust the capacitance to tune the frequency response of $g_m$ of the amplifier.

11. The inductor circuit of claim 1 wherein the compensation circuit comprises a tuner having first and second tuner terminals, the first tuner terminal is coupled to a control terminal of an amplifier and the second tuner terminal is coupled to an first terminal of the amplifier, the tuner comprises a capacitor to tune an effective inductance of the inductor circuit.

12. The inductor circuit of claim 1 wherein the compensation circuit comprises a tuner having first and second tuner terminals, the first tuner terminal is coupled to a control terminal of an amplifier and the second tuner terminal is coupled to a first terminal of the amplifier, the tuner comprises a varactor having a bias voltage to adjust the capacitance to tune an effective inductance of the inductor circuit.

13. An inductor comprising:
   a substrate having a dielectric layer, the dielectric layer comprising
      a first inductor track defined in a first plane of the dielectric layer, the first inductor track having at least inner and outer concentric first inductor sub-tracks,
      a second inductor track defined in the first plane of the dielectric layer between the inner and outer first inductor sub-tracks, and
      a third inductor track defined in a second plane of the dielectric layer;
   a first inductor comprising having first and second first inductor terminals at first and second ends of the first inductor, the first inductor is disposed in the first inductor track, the first inductor forms continuous concentric loops in the first inductor track between the first and second first inductor terminals, wherein the continuous loops are facilitated by first inductor cross-over connectors;
   a second inductor having first and second second inductor terminals, the second inductor is disposed in the second inductor track to form a loop between the first and second second inductor terminals;
   a third inductor having first and second third inductor terminals, the third inductor is disposed in the third inductor track in the second plane; and
   wherein the second and third inductors are electrically isolated from the first inductor, the second and third inductors are magnetically coupled to provide an inductive feed back loop for compensating loss in the first inductor.

14. The inductor of claim 13 wherein the loops of the inductors comprise an octagonal shape.

15. The inductor of claim 13 wherein the outer loop of the first inductor comprises first and second portions having first and second ends and the inner loop of the first inductor comprises an open loop having first and second ends, wherein the second end of the first outer loop portion is coupled to the second end of the inner loop in the first plane and the second end of the second outer loop portion is coupled to the first end of the inner loop in a plane different from the first plane to form a cross-over coupling.

16. A method of increasing Q factor of an inductor comprising:
   providing a primary inductor ($L_1$) which incurs a loss equal to series resistance ($R_1$); and
   generating a negative inductance $R_{neg}$ from a compensation sub-circuit having a secondary inductor to compensate for the loss $R_1$, the compensation sub-circuit is electrically isolated from $L_1$ and magnetically coupled to $L_1$ to form an inductive feed back loop, wherein $R_{neg}$ reduces $R_1$ to increase Q factor of the primary inductor, wherein the primary inductor comprises a loss corresponding to $R_1$ wherein the magnitude of $R_{neg}$ is at least within 90-95% of $R_1$ to enhance the Q factor of the primary inductor.

17. An integrated circuit comprising:
   an inductor circuit, wherein the inductor circuit comprises a primary inductor ($L_1$), and
      a compensation sub-circuit having a secondary inductor $L_S$, the compensation sub-circuit is electrically isolated from the primary inductor, the compensation sub-circuit is magnetically coupled with the primary inductor to provide an inductive feedback loop for compensating loss in the primary inductor to enhance Q factor of the inductor circuit,
   wherein the primary inductor comprises a loss corresponding to series resistance $R_1$ and the compensation sub-circuit generates a negative resistance $R_{neg}$ to compensate for the loss $R_1$, wherein the magnitude of $R_{neg}$ is at least within 90-95% of $R_1$ to enhance the Q factor of the primary inductor.

18. The integrated circuit of claim 17 wherein $L_S$ comprises first and second secondary inductors for compensating loss in the primary inductor to enhance the Q factor of the inductor circuit.

19. The integrated circuit of claim 17 wherein the compensation sub-circuit comprises an amplifier having a transconductance $g_m$, the amplifier includes a control terminal and first and second terminals, wherein the control terminal of the amplifier is coupled to a first terminal of $L_S$ and the first terminal of the amplifier is coupled to a second terminal of $L_S$.

20. The inductor of claim 13 wherein the second and third inductors form part of a compensation sub-circuit which is electrically isolated from the first inductor, the compensation sub-circuit is configured to generate a negative resistance $R_{neg}$ to compensate for a loss $R_1$ of the first inductor.

21. The inductor of claim 20 wherein the magnitude of $R_{neg}$ is at least within 90-95% of $R_1$ to enhance the Q factor of the inductor circuit.

22. The inductor of claim 20 wherein the compensation sub-circuit is magnetically coupled with the first inductor for compensating loss in the primary inductor to enhance Q factor of the inductor circuit.

23. A method of forming an inductor comprising:
providing a substrate;
providing a primary inductor ($L_1$) which incurs a loss equal to series resistance ($R_1$) on the substrate; and
providing a compensation sub-circuit having a secondary inductor on the substrate, the compensation sub-circuit is electrically isolated from the primary inductor, the compensation sub-circuit generates a negative inductance $R_{neg}$ by magnetically coupling to the primary inductor to form an inductive feed back loop, wherein $R_{neg}$ reduces $R_1$ to increase Q factor of the inductor, wherein the magnitude of $R_{neg}$ is at least within 90-95% of $R_1$ to enhance the Q factor of the primary inductor.

24. The method of claim 23 wherein the secondary inductor comprises first and second secondary inductors for compensating loss in the primary inductor to enhance the Q factor of the inductor.

25. The method of claim 24 wherein the negative resistance $R_{neg}$ is configured to compensate for the loss $R_1$.

* * * * *